(12) United States Patent
Siemieniec et al.

(10) Patent No.: US 12,471,302 B2
(45) Date of Patent: Nov. 11, 2025

(54) SILICON CARBIDE DEVICE WITH TRENCH GATE STRUCTURE

(71) Applicant: Infineon Technologies AG, Neubiberg (DE)

(72) Inventors: Ralf Siemieniec, Villach (AT); Wolfgang Jantscher, Villach (AT); David Kammerlander, Villach (AT)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 17/532,333

(22) Filed: Nov. 22, 2021

(65) Prior Publication Data

US 2022/0085186 A1 Mar. 17, 2022

Related U.S. Application Data

(62) Division of application No. 16/832,653, filed on Mar. 27, 2020, now Pat. No. 11,211,468.

(30) Foreign Application Priority Data

Mar. 28, 2019 (DE) .......................... 102019108062.2

(51) Int. Cl.
*H10D 62/832* (2025.01)
*H01L 21/04* (2006.01)
(Continued)

(52) U.S. Cl.
CPC ....... *H10D 12/031* (2025.01); *H01L 21/0465* (2013.01); *H01L 21/047* (2013.01);
(Continued)

(58) Field of Classification Search
CPC ....... H01L 21/046–047; H01L 29/1095; H01L 29/7802–7815; H01L 29/7813;
(Continued)

(56) References Cited

U.S. PATENT DOCUMENTS

| 8,188,484 B2 | 5/2012 | Nakano |
| 9,887,287 B1 | 2/2018 | Lichtenwalner et al. |
| 2011/0049532 A1 | 3/2011 | Odekirk et al. |
| 2013/0105889 A1* | 5/2013 | Fujiwara ............. H01L 29/0878 438/270 |
| 2014/0145206 A1* | 5/2014 | Siemieniec ......... H01L 29/7813 257/334 |

(Continued)

FOREIGN PATENT DOCUMENTS

| JP | 2010147228 A | 7/2010 |
| JP | 2018107342 A | 7/2018 |

(Continued)

*Primary Examiner* — Eric A. Ward
(74) *Attorney, Agent, or Firm* — Murphy, Bilak & Homiller, PLLC

(57) ABSTRACT

A silicon carbide device includes a silicon carbide body with a trench gate structure that extends from a first surface into the silicon carbide body. A body region is in contact with an active sidewall of the trench gate structure. A source region is in contact with the active sidewall and located between the body region and the first surface. The body region includes a first body portion directly below the source region and distant from the active sidewall. In at least one horizontal plane parallel to the first surface, a dopant concentration in the first body portion is at least 150% of a reference dopant concentration in the body region at the active sidewall and a horizontal extension of the first body portion is at least 20% of a total horizontal extension of the body region.

10 Claims, 10 Drawing Sheets

(51) Int. Cl.
  *H10D 12/01* (2025.01)
  *H10D 30/66* (2025.01)
  *H10D 62/17* (2025.01)
  *H10D 84/00* (2025.01)

(52) U.S. Cl.
  CPC ......... *H10D 30/668* (2025.01); *H10D 62/393* (2025.01); *H10D 62/8325* (2025.01); *H10D 84/144* (2025.01)

(58) Field of Classification Search
  CPC ............. H01L 21/0465; H01L 29/1608; H01L 29/66068; H01L 29/7805
  See application file for complete search history.

(56) References Cited

U.S. PATENT DOCUMENTS

| | | |
|---|---|---|
| 2016/0172468 A1 | 6/2016 | Esteve et al. |
| 2016/0293743 A1 | 10/2016 | Darwish et al. |
| 2018/0277637 A1 | 9/2018 | Meiser et al. |
| 2018/0337275 A1 | 11/2018 | Shimizu et al. |
| 2019/0074372 A1* | 3/2019 | Kobayashi ............ H01L 21/047 |
| 2019/0074373 A1* | 3/2019 | Kobayashi .......... H01L 29/0878 |
| 2020/0212183 A1 | 7/2020 | Utsumi et al. |

FOREIGN PATENT DOCUMENTS

| | | |
|---|---|---|
| WO | 2011027540 A1 | 3/2011 |
| WO | 2014103256 A1 | 7/2014 |

\* cited by examiner

SILICON CARBIDE DEVICE WITH TRENCH GATE STRUCTURE

TECHNICAL FIELD

Examples of the present disclosure relate to silicon carbide devices, in particular, to silicon carbide devices with trench gate structures and to methods of manufacturing silicon carbide devices with trench gate structures.

BACKGROUND

Power semiconductor devices are typically used as switches and rectifiers in electric circuits for transforming electrical energy, for example, in DC/AC converters, AC/AC converters or AC/DC converters, and in electric circuits that drive heavy inductive loads, e.g., in motor driver circuits. Since the dielectric breakdown field strength of silicon carbide (SiC) is high compared to silicon, SiC devices may be significantly thinner and may show lower on-state resistance than their silicon counterparts. Typically, in SiC devices the contribution of the channel resistance to the overall on state resistance is greater than it is the case for equivalent silicon devices.

There is a need for improving silicon carbide device parameters.

SUMMARY

An embodiment of the present disclosure relates to a method of manufacturing a silicon carbide device. A silicon carbide body is provided. A trench gate structure is formed that extends from a first surface into the silicon carbide body. A body region is formed in contact with an active sidewall of the trench gate structure. A source zone located between the body region and the first surface is formed in contact with the active sidewall. Dopants are implanted into a first body portion of the body region, wherein the first body portion is located directly below the source zone and distant from the active sidewall. In at least one horizontal plane a dopant concentration in the first body portion is at least 150% of a reference dopant concentration in the body region in the horizontal plane at the active sidewall body region and a horizontal extension of the first body portion is at least 20% of a total horizontal extension of the body region.

Another embodiment of the present disclosure relates to a silicon carbide device that includes a silicon carbide body. A trench gate structure extends from a first surface into the silicon carbide body. A body region is in contact with an active sidewall of the trench gate structure. A source region located between the body region and the first surface is in contact with the active sidewall. The body region includes a first body portion directly below the source region and distant from the active sidewall. In at least one horizontal plane parallel to the first surface a dopant concentration in the first body portion is at least 150% of a reference dopant concentration in the body region in the horizontal plane at the active sidewall and a horizontal extension of the first body portion is at least 20% of a total horizontal extension of the body region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a silicon carbide device and a method of manufacturing a silicon carbide device and together with the description serve to explain principles of the embodiments. Further embodiments are described in the following detailed description and the claims.

DETAILED DESCRIPTION

Figure 1A:
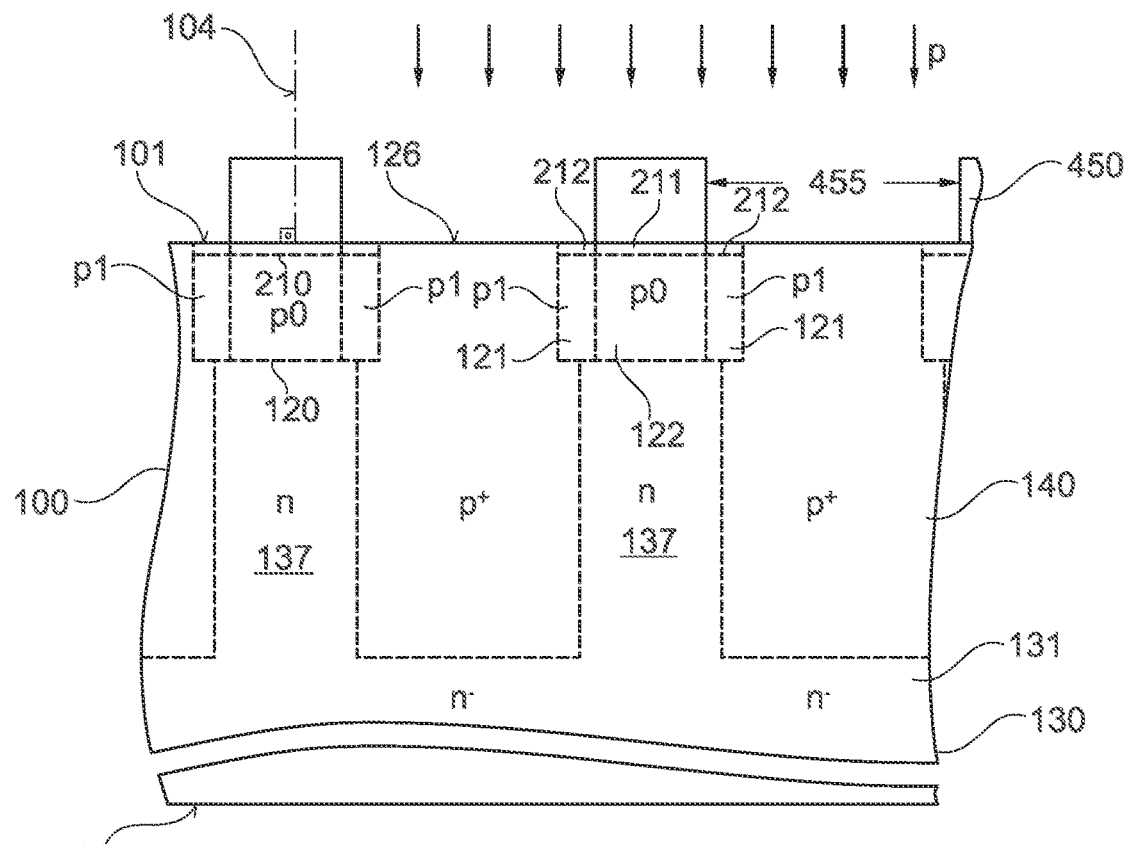
FIGS. 1A-1B show schematic vertical cross-sectional views of a portion of a silicon carbide body for illustrating a method of manufacturing a silicon carbide device with a heavily doped body portion according to an embodiment.

In the following detailed description, reference is made to the accompanying drawings, which form a part hereof and in which are shown by way of illustrations specific embodiments in which a silicon carbide device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

An ohmic contact is a non-rectifying electrical junction with a linear or almost linear current-voltage characteristic. A Schottky contact is a metal-semiconductor junction with rectifying characteristics, wherein the work function of the metal and the dopant concentration in the semiconductor material are selected such that in the absence of an externally applied electric field a depletion zone forms in the semiconductor material along the metal-semiconductor junction. In the context of a Schottky contact, the term "metal-semiconductor junction" may also refer to a junction between a metal-like semiconductor and a semiconductor, wherein the junction has the same characteristics as a metal-semiconductor junction. For example, it may be possible to form a Schottky contact between polycrystalline silicon and silicon carbide. If two components (e.g., two regions) form an ohmic contact or a Schottky contact, respectively, this may mean that an ohmic contact or a Schottky contact is present between said two components. In both cases, it may be possible for said two regions to directly adjoin each other. However, it may also be possible that a further component is positioned between said two components.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, nickel and silicon are the main constituents of a nickel silicide layer and copper and aluminum are the main constituents of a copper aluminum alloy.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

As regards structures and doped region formed in a silicon carbide body, a second region is "below" a first region if a minimum distance between the second region and a first surface at the front side of the silicon carbide body is greater than a maximum distance between the first region and the first surface. The second regions is "directly below" the first region, where the vertical projections of the first and second regions into the first surface overlap. The vertical projection is a projection orthogonal to the first surface. A "horizontal plane" is a plane parallel to a planar first surface or parallel to coplanar surface sections of the first surface.

According to an embodiment, a method of manufacturing a silicon carbide device may include providing a silicon carbide body. A trench gate structure may be formed that extends from a first surface into the silicon carbide body. A body region and a source zone may be formed in contact with an active sidewall of the trench gate structure, wherein the source zone is located between the body region and the first surface. A source region may be formed in the source zone prior to or after forming the trench gate structure.

The body region and the source region are oppositely doped and form a pn junction. Here and in the following, the conductivity type of the source region is denominated as the first conductivity type and the conductivity type of the body region is denominated as the second conductivity type. The dopants defining the body region and the source region may be introduced into the silicon carbide body prior to or after forming the trench gate structure, or after forming at least a partial structure of the trench gate structure, e.g., after forming a trench, after forming a sacrificial layer on a trench sidewall, or after forming a gate dielectric along at least a portion of a trench sidewall.

The trench gate structure includes a conductive gate electrode and a gate dielectric between at least the body region and the gate electrode.

Before or after forming the trench gate structure, dopants may be implanted into a first body portion of the body region, wherein the first body portion is located directly below the source zone and distant from the active sidewall. The dopants have the second conductivity type and enhance the net dopant concentration in the first body portion with respect to a second body portion between the first body portion and the active sidewall. As a result, in at least one horizontal plane parallel to the first surface, a mean dopant concentration in the first body portion may be at least 150% of a reference dopant concentration and a horizontal extension of the first body portion may be at least 20% of a total horizontal extension of the body region. The reference dopant concentration is the dopant concentration in the body region at the active sidewall in the same horizontal plane.

The dopant concentration within the first body portion and/or within the second body portion may be constant. In this context, "constant" may mean that the dopant concentration varies by at most ±10% of the mean dopant concentration within the first body portion and/or the second body portion, respectively.

A transition region is located between the first body portion and the second body portion. Within the transition region, the horizontal dopant gradient may show a decline from at least 90% of the mean dopant concentration in the first body portion and/or from at least 130% of the reference dopant concentration to at most 110% of the reference dopant concentration. The transition region has a distance to the active sidewall which means that the first body portion is distant from the active sidewall.

Alternatively or in addition, the first body portion may extend across at least 50% of a total horizontal extension of the body region.

Along active sidewalls inversion channels are formed in the on-state of the silicon carbide device. No inversion channels are formed at operation within the SOA along inactive sidewalls. Each trench gate structure may include one, two, three, four, or six active sidewalls.

The first body portion and the second body portion form a unipolar junction. A minimum distance between the trench gate structure and the unipolar junction may be at least 100 nm, e.g., at least 200 nm.

In a blocking mode of a silicon carbide device with field effect transistor structures, a space-charge region (depletion region) may penetrate from a side opposite to the source zone (e.g., from the drift structure) into the body region. The depletion region may extend into a channel region of the silicon carbide device and thus may lower a potential barrier between the body region and a region opposite the source region (e.g., a drift structure). This may lead to lowering of the gate threshold voltage (so-called "barrier lowering"). This drain-induced barrier lowering (DIBL) may significantly influence a gate threshold voltage and may impair an electrical characteristic of the silicon carbide device.

By providing the first body portion with an increased doping concentration in the body region, the extension of the depletion region may be reduced. A difference of the first body portion from the channel region and/or gate structure may be chosen such that, on the one hand, the difference is large enough to avoid a harmful increase of the gate threshold voltage due to the increase in doping concentration in the first body portion and, on the other hand, the difference is small enough to allow for deviating the depletion region into the first body portion. Since the first body portion has a sufficient distance to the trench gate structure with the gate dielectric, the higher dopant concentration in the first body portion has no or only a marginal effect on the nominal gate threshold voltage. Formation of the first body portion leaves the lateral extension of the source region unaffected and does not or only to a marginal degree impair the contact resistance of the source region.

According to an embodiment, the dopants for forming the first body portion may be implanted into the first body portion prior to forming the trench gate structure. In this way, the first body portion may be formed without adverse impact on structures in the trench gate structure, for example, without adverse impact of the implanted ions on a gate dielectric.

According to an embodiment, an implant axis for implanting the dopants into the first body portion may be tilted to a vertical direction of the silicon carbide body. The implant axis may be oriented such that the dopants for the first body portion are implanted towards an active sidewall of the trench gate structure. For example, the dopants may be implanted from a side at which the body region directly adjoins the trench gate structure towards the trench gate structure. The implant axis runs parallel to the direction of the ion beam that implants the dopants.

The implant axis and the vertical direction enclose an implant angle above the first surface. Below the first surface, the implant axis and the vertical direction enclose the negative implant angle.

The active sidewall of the gate trench structure may either run along the vertical direction or may enclose a taper angle with the vertical direction at the first surface. In either case, the gate trench structure may comprise at least one active sidewall, in some cases at least two opposing active sidewalls or even more than two active sidewalls (e.g., four or six active sidewalls). For each active sidewall, the implant axis may be chosen according to the orientation of said active sidewall. The active sidewall or at least one of the active sidewalls may run essentially (i.e., within a tolerance of ±2° or ±1°) along a main crystal plane of the silicon carbide body. The gate trench structure may furthermore comprise at least one inactive sidewall, where no channel is formed.

A tapered trench gate structure is usually used in the case of a silicon carbide body with a so-called off-axis angle. The taper angle may differ from the off-axis angle in absolute value by at most 2°, in particular at most 1°. In other embodiments, the silicon carbide body may be provided with an off-axis angle, but the sidewalls may still run along the vertical direction.

For each active sidewall, the implant axis may be chosen such that the implantation direction and the active sidewall and/or one main crystal direction (e.g., the c axis) of the silicon carbide body have the same relative orientation, but deviate in absolute value (e.g., deviate by at least 1° or at most 2° and at most 10° or at most 8° or at most 5°). In some embodiments, the implant angle and the taper angle may have the same sign (i.e., may both be oriented clockwise or anti-clockwise), but may deviate in absolute value. That is to say, the implant axis and the active sidewall and/or one main crystal direction may have the same relative orientation (e.g., the same tilt direction), but may differ in absolute value.

In general (e.g., in the tapered case and in the case of a gate trench structure with an active sidewall along the vertical direction), the implant angle may be chosen such that the implant axis is tilted away from the active sidewall. In other words: the implantation may be directed towards the active sidewall. An acute angle (i.e., an angle that is less than 90°) between the implantation axis and the first surface may be smaller (in absolute value) than an acute angle between the active sidewall and the first surface.

The implant angle may be chosen such that the implant axis differs from a main crystal plane (e.g., all main crystal planes) and/or a main crystal axis (e.g., all main crystal axes) of the silicon carbide body. Typically, the implant angle is chosen larger than the taper angle and/or the off-axis angle in absolute value. For example, the implant angle may be at least 2°, e.g. at least 3° or at least 4°, larger than the taper angle and/or the off-axis angle in absolute value. In the case of a trench gate structure with vertical sidewalls, the taper angle is assumed to be 0° in the afore-mentioned relation.

In one embodiment, the taper angle and/or the off-axis angle may be at least 2° and at most 6°, e.g. 4°, in absolute value. The implant angle may then be at least 6° (e.g., at least) 7° and at most 14° (e.g., at most 12° or at most 11°) in absolute value. However, in some embodiments the implant angle in the case of a tapered trench gate structure may be smaller than 6°. In general, the taper angle of the active sidewall and the implant angle of the implant corresponding to said active sidewall may both either be negative ("clockwise orientation") or positive ("counter-clockwise").

By using a tilted implant, it may be possible to reduce or avoid channeling effects. Channeling usually occurs when the implant axis is essentially parallel to a main crystal direction along which the crystal lattice forms continuous lattice channels. When channeling occurs, the implant depth may strongly vary in response to only slight changes of the implant angle. A sufficiently large preset angle between the implant axis and a main crystal direction can reduce fluctuations of the implant depth to a high degree.

In addition, or as an alternative, by using a tilted implant, lateral straggling may be reduced. Vertical implants (i.e., where the implant axis runs essentially parallel to the vertical direction) into semiconductor materials usually show lateral struggling such that in case of masked implants a portion of the implanted ions comes to rest outside the vertical projection of the openings. In contrast to this, a tilted implant into the direction of the active sidewall from the side of the body region may reduce lateral straggling at the averted side of the mask, i.e., at the side from which the tilted implant points away.

An implant mask masking the dopant implant for the first body portion may include comparatively wide openings and comparatively narrow mask bars between the openings. In addition, each mask bar may be located asymmetrically with respect to the interface between trench gate structure and body region. In particular, a lateral distance between the gate dielectric and a first edge of the mask bar above the body region may be greater than a lateral distance between the gate dielectric and a second edge of the mask bar above the trench gate structure.

In case of a vertical implant straggling at the side of the second edge of the mask bar may increase the dopant concentration directly along the gate dielectric and thus the gate threshold voltage.

With the tilted implant it is possible that lateral struggling at the side of the second edge of the mask bar has no or only insignificant effect on the gate threshold voltage.

An implant angle between the implant axis and the vertical direction may be at least 3°, e.g., at least 7°, e.g., at least or exactly 11° in absolute value.

According to an embodiment, a body enhancement implant mask may be formed on the first surface and the dopants may be implanted into the first body portion through an opening in the body enhancement implant mask. The body enhancement implant mask may cover at least a first source portion of the source zone. The opening in the body enhancement implant mask may expose at least a body contact area of the first surface. The body contact area laterally directly adjoins the source zone. In the body contact area, a low-resistive ohmic contact may be formed between the body region and a first load electrode at the front side of the silicon carbide body at a later stage of processing.

For example, the body enhancement implant mask may cover the complete source zone and the opening in the body enhancement implant mask may expose only the body contact area. In this way it is possible that the body enhancement implant may also be used as body contact implant mask that defines a heavily doped body contact region in the body contact area.

For example, the heavily doped body contact region may be formed by implanting dopants at low implant energy through the opening in the body enhancement implant mask, wherein an end of range peak of the dopants is at a distance to the first surface and the distance is within the range of the vertical extension of the source zone.

Forming the first body portion may include at least one tilted implant. The implant energy for the tilted implant may be selected such that the end-of-range peak is within the body region and at a distance to the source zone. Implanting the dopants into the first body portion may include one, two, or more than two implants at different implant energy. The dose of the various implants may be the same or may be different. Using the same implant mask for one or more tilted implants, which define the first body portion directly below the source region, and for an implant, which defines a body contact portion directly adjacent to the source region, facilitates formation of the first body portion at low additional effort.

According to an embodiment, the opening in the body enhancement implant mask may expose the body contact area and a second source portion of the source zone, wherein the second source portion is located between the body contact area and the first source portion. In this way, the first body portion may be formed with greater lateral extension with respect to the source region. The extension of the depleted portion of the body region in the blocking mode may be further reduced. As a result, the DIBL effect may be further reduced without reducing the lateral extension of the source region.

According to an embodiment, a body contact implant mask may be formed on the first surface, wherein the body contact implant mask may cover the source zone and wherein an opening in the body contact implant mask exposes the body contact area. Dopants of the conductivity type of the body region, i.e., dopants of the second conductivity type, may be implanted through the opening in the body contact implant mask. The implanted dopants may form a heavily doped body contact region laterally adjacent to the source zone. An implant dose may be sufficiently high such that the body contact region forms a low-resistive ohmic contact with a first load electrode that may be formed at a later stage.

After forming the body contact region, the body contact implant mask may be laterally recessed. The body contact implant mask may be exclusively laterally recessed, wherein only the opening becomes wider. Alternatively, the lateral recess may also include a vertical recess at a same or at a different recess rate. For example, an isotropic etch may recess the body contact implant mask laterally and vertically, wherein the recess also reduces the thickness of the body contact implant mask. The at least laterally recessed body contact implant mask may form the body enhancement implant mask.

In this way the body enhancement implant mask may be formed in an efficient way without additional lithography process. The first body portion and a body contact region may be formed in a self-aligned manner.

According to an embodiment, a deep implant mask may be formed on the first surface, wherein the deep implant mask may cover a third source portion of the source zone. An opening in the deep implant mask may expose the body contact area and a fourth source portion of the source zone. The fourth source portion is located between the body contact area and the third source portion. Dopants of the conductivity type of the body region, i.e., dopants of the second conductivity type, are implanted through the opening in the deep implant mask, wherein an end of range peak of the dopants is at a distance to the first surface and the distance may be greater that a maximum distance between the body region and the first surface.

The dopants may form a deep shielding portion. Implanting the dopants into the deep shielding portion may include one, two, or more than two implants at different implant energy. The dose of the various implants may be the same or may be different.

After forming the deep shielding portion, the deep implant mask may be laterally recessed. The laterally recessed deep implant mask may form the body enhancement implant mask. In this way the body enhancement implant mask may be formed in an efficient way without additional lithography process. The first body portion may be formed self-aligned to a deep shielding portion of the same conductivity type, wherein the deep shielding portion may shield the trench gate structure against a potential of a drain electrode and/or may provide body diode.

According to an embodiment, a body contact implant mask may be formed on the first surface, wherein the body contact implant mask covers the source zone and an opening in the body contact implant mask exposes the body contact area. Dopants of the second conductivity type may be implanted through the opening in the body contact implant mask to form a heavily doped body contact portion. Then the body contact implant mask may be laterally recessed to provide a laterally recessed body contact implant mask.

The laterally recessed body contact implant mask may form the deep implant mask. Dopants of the second conductivity type may be implanted through the opening in the deep implant mask to form a deep shielding portion. Then the deep implant mask may be laterally recessed to provide a laterally recessed deep implant mask. The laterally recessed deep implant mask may form the body enhancement implant mask for forming the first body portion.

In this way the deep shielding portion, the body contact portion and the first body portion may be formed in an efficient way on the basis of one single lithography process. The first body portion, the body contact portion, and the deep shielding portion may be formed self-aligned to each other, i.e., without lithographic overlay displacements.

According to an embodiment, dopants of the conductivity type complementary to the conductivity type of the body region, i.e., dopants of the first conductivity type, may be implanted into the source zone to form a doped source region in the source zone. The source region may be formed prior to the formation of the first body portion or after formation of the first body portion.

According to an embodiment, a horizontal extension of the first body portion in the at least one horizontal plane is at least 20% of a total horizontal extension of the body region. An overlap of 20% of the first body portion with the source region results in a significant improvement against DIBL. According to other embodiments, the horizontal extension of the first body portion may be at least 40% or even 50% of the total horizontal extension of the body region, wherein the DIBL effect is further reduced without that the presence of the first body portion effects the nominal gate threshold voltage.

According to at least one another embodiment, a silicon carbide device may include a silicon carbide body with a trench gate structure, wherein the trench gate structure extends from a first surface of the silicon carbide body into the silicon carbide body. A body region is in contact with the active sidewall of the trench gate structure. A source region is in contact with the active sidewall. The source region is located between the body region and the first surface. The body region may include a first body portion directly below the source region and distant from the active sidewall. In at least one horizontal plane parallel to the first surface a dopant concentration in the first body portion is at least 150% of a reference dopant concentration in the horizontal plane at the active sidewall.

The silicon carbide device may be or may include an IGFET (insulated gate field effect transistor), for example, an MOSFET (metal oxide semiconductor FET) in the usual meaning including FETs with metal gates as well as FETs with gates from semiconductor material or an MCD (MOS controlled diode), by way of example.

The additional dopants in the first body portion may contribute in reducing the effect of the depletion region on the barrier height. The first body portion may reduce drain-induced barrier lowering and may improve stability of electrical characteristics of the silicon carbide device.

According to an embodiment, in the at least one horizontal plane a horizontal extension of the first body portion is at least 20% of a total horizontal extension of the body region.

According to an embodiment, the silicon carbide device may further include a shielding region of a conductivity type of the body region, i.e., of the second conductivity type. The shielding region may extend from the first surface into the silicon carbide body and may laterally directly adjoin the source region and the body region.

For example, the shielding region may be formed between the source region and the body region at one side and a further trench gate structure at the other side. The shielding region may separate the source region and the body region from a further trench gate structure. A vertical extension of the shielding region may be greater than the vertical extension of the trench gate structure. The shielding region may include a portion directly below the trench gate structure, wherein the shielding region may shield the trench gate structure against the drain potential and may reduce the maximum electric field strength occurring along the edge of the trench gate structure.

According to an embodiment, in the at least one horizontal plane the lateral dopant distribution in a portion of the shielding region directly adjoining the first body portion may be equal to the dopant concentration in the first body portion. At least a vertical section of the shielding region and the first body portion may result from these implants.

According to another embodiment, the shielding region may be in contact with a second sidewall of a further trench gate structure.

According to an embodiment, the first body portion may result from a tilted implant. The implant angle may have been chosen in a range from 3° to 11° in absolute value, by way of example. A tilted implant may, for example, be visible in the device from the shape of the first body portion. Dopants in a silicon carbide semiconductor material typically show no diffusion. Thus, even after activating the dopants, an asymmetric shape caused by a tilted implant may still be visible in the first body portion.

FIGS. 1A to 4D refer to methods of manufacturing a silicon carbide device. The silicon carbide device may be manufactured from a silicon carbide substrate that comprises at least one silicon carbide body 100. From each silicon carbide body 100, at least one semiconductor die (chip) of one silicon carbide device can be obtained.

For example, the silicon carbide body 100 may include or consist of a silicon carbide layer grown by epitaxy on a suitable single-crystalline base.

The silicon carbide body 100 may be of the polytype 15R-SiC, 2H-SiC, 4H-SiC or 6H-SiC, by way of example. In addition to the main constituents silicon and carbon, the silicon carbide body 100 may include dopant atoms, for example nitrogen N, phosphorus P, beryllium Be, boron B, aluminum Al, and/or gallium Ga. Further, the silicon carbide body 100 may include unwanted impurities, for example hydrogen and/or oxygen.

The silicon carbide body 100 comprises a first surface 101 at a front side and an opposing second surface 102 at the rear side. The first surface 101 and the second surface 102 may be parallel to each other, wherein the first surface 101 may be planar or ripped. In case of a ripped first surface 101, a mean plane through the ripped main surface 101 is regarded as first surface 101 for simplicity in the following.

The silicon carbide body 100 extends along a main extension plane in horizontal directions (which are also referred to as lateral directions in the following). Perpendicular to the horizontal directions, in a vertical direction 104, the silicon carbide body 100 has a thickness, which is small compared to the extension of the silicon carbide body 100 along the main extension plane. A longitudinal direction may run along a lateral direction in the following.

The vertical direction 104 of the silicon carbide body 100 may coincide with a main lattice direction or may be tilted with respect to a main lattice direction by an off-axis angle, wherein the off-axis angle may be in a range from 2° to 8° in absolute value. At the rear side of the silicon carbide body 100, a second surface 102 may extend parallel to a planar first surface 101 or parallel to a mean plane of a ripped first surface 101.

A total thickness of the silicon carbide body 100 between the first surface 101 and the second surface is related to a nominal blocking capability of the manufactured silicon carbide device and may be in the range of several hundred nm to several hundred μm.

The following embodiments refer to silicon carbide devices with n-channel transistor cells with n-doped source regions and with p doped body regions. Accordingly, the conductivity type of the source regions—or first conductivity type is n-type—and the conductivity type of the body regions—or second conductivity type—is p-type. The disclosure with regard to the n-channel transistor cells may apply, mutatis mutandis, to p-channel transistor cells by reversing the conductivity type of the source and body regions.

The silicon carbide body 100 includes a drift structure 130 with a lightly n doped drift zone 131. The drift structure 130 may optionally include n doped current spread regions 137 between the first surface 101 and the drift zone 131, wherein the current spread regions 137 may directly adjoin the drift zone 131. Between neighboring current spread regions, p doped shielding regions 140 may extend in the silicon carbide body 100 from body contact areas 126 into the drift structure 130, wherein the body contact areas 126 are sections of the first surface 101.

The shielding regions 140 and the current spread regions 137 may be stripe-shaped, wherein horizontal longitudinal axes of the shielding regions 140 and the current spread regions 137 extend orthogonally to the cross-sectional plane. Other shapes may, however, also be possible, depending on the desired shape of the transistor cells (e.g., the shape of the gate trenches).

P doped body regions 120 located between the first surface 101 and the current spread regions 137 may directly adjoin the current spread regions 137 in a vertical direction. A maximum dopant concentration in the body regions 120 may be lower than a maximum dopant concentration in the shielding region 140.

Source zones 210 located between the first surface 101 and the body region 120 may directly adjoin the body regions 120. Each source zone 210 includes a first source portion 211 in the center and second source portions 212 between the first source portion 211 and the neighboring body contact areas 126. In the source zones 210 heavily n doped source regions 110 may be formed prior to or after the p-type implant described in the following.

A body enhancement implant mask 450 is formed on the first surface 101 and p-type dopants are implanted through openings 455 in the body enhancement implant mask 450.

FIG. 1A shows the body enhancement implant mask 450 covering the first source portions 211. The openings 455 in the body enhancement implant mask 450 expose the body contact areas 126 and the second source portions 212. The openings 455 may be stripe-shaped, wherein longitudinal axes of the openings 455 extend orthogonally to the cross-sectional plane.

P-type dopant ions may be implanted through the openings 455 at one or more different implant energies, wherein implants at different implant energies may have the same implant dose or different implant doses. The implant axis may be vertical, i.e. parallel to the vertical direction 104 or may be tilted to the vertical direction 104 by an implant angle β. The implant angle β is in the cross-sectional plane, in a cross direction to the longitudinal axes of the openings 455. The implanted p-type dopant ions form heavily doped first body portions 121 directly below the second source portions 212.

The body enhancement implant mask 450 may be removed. N-type dopants may be implanted into the source zones 210 to form source regions 110 in the source zones 210. A trench mask may be formed on the first surface 101. The trench mask may have stripe-shaped openings with longitudinal axes orthogonal to the cross-sectional plane. Each opening in the trench mask may laterally overlap with one current spread region 137 and with one shielding region 140. Using the trench mask as an etch mask, gate trenches may be etched into the silicon carbide body 100. A gate dielectric 159 may be formed that lines at least portions of the gate trenches. One or more conductive materials may be deposited. The conductive materials form a gate electrode 155 in the gate trenches. Portions of the deposited conductive materials deposited outside the gate trenches may be removed.

Figure 1B:
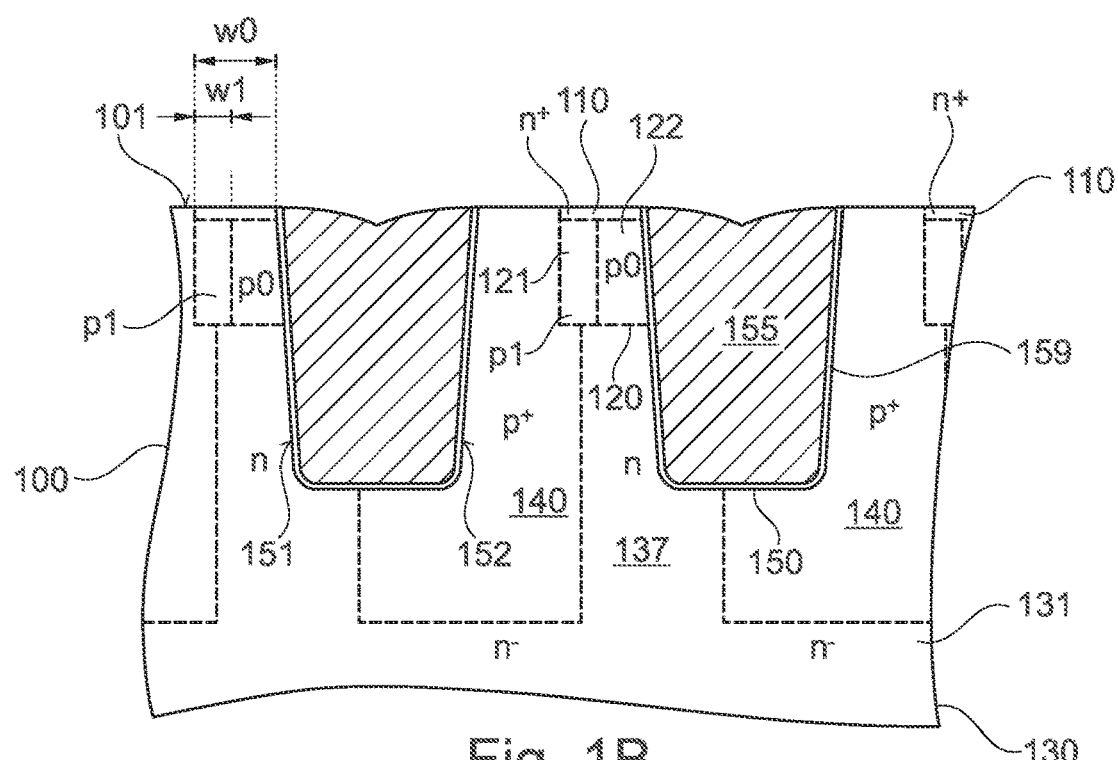

FIG. 1B shows trench gate structures 150 extending from the first surface 101 into the silicon carbide body 100. Each trench gate structure 150 includes a conductive gate electrode 155 and a gate dielectric 159 between the gate electrode 155 and the silicon carbide body 100. Sidewalls 151, 152 of the trench gate structures 150 may be orthogonal to the first surface 101. According to the illustrated embodiment the trench gate structures 150 taper with increasing distance to the first surface 101 such that both sidewalls 151, 152 are tilted to the vertical direction 104.

At least one of the sidewalls 151, 152 may be an active sidewall parallel to crystal planes with high charge carrier mobility. Along the active sidewall 151 an inversion channel is formed in a body region in an on-state of the semiconductor device. Along an inactive sidewall 152 no inversion channel is formed in the body region provided that the semiconductor device is operated within the SOA. Though the following figures refer to trench gate structures 150 with only one active sidewall 151 at the left side of each trench gate structure 150, the embodiments may also apply to trench gate structures 150 with only one active sidewall 151 at the right side of each trench gate structure or to trench gate structures 150 with two or more active sidewalls 151.

The source regions 110 and the body regions 120 are in contact with the active sidewalls 151 of the trench gate structures 150. The body regions 120 separate the source regions 110 from the current spread regions 137. The current spread regions 137 form low-resistive connections between the body regions 120 and the lightly doped drift zone 131.

The heavily doped shielding regions 140 separate the source regions 110, the body regions 120 and the current spread regions 137 from the neighboring trench gate structures 150. A vertical extension of the shielding regions 140 may be greater than a vertical extension of the trench gate structures 150.

Each body region 120 is formed directly below one source region 110. A first body portion 121 of the body region 120 directly adjoins the shielding region 140 and is spaced from the trench gate structure 150. A second body portion 122 of the body region 120 is located between the first body portion 121 and the trench gate structure 150. A maximum net dopant concentration p1 in the first body portion 121 is greater than, e.g., at least twice as high as a maximum net dopant concentration p0 in the second body portion 122. For example, a maximum net dopant concentration p1 in the first body portion 121 may be at least ten times as high as a maximum net dopant concentration p0 in the second body portion 122.

Figure 2A:
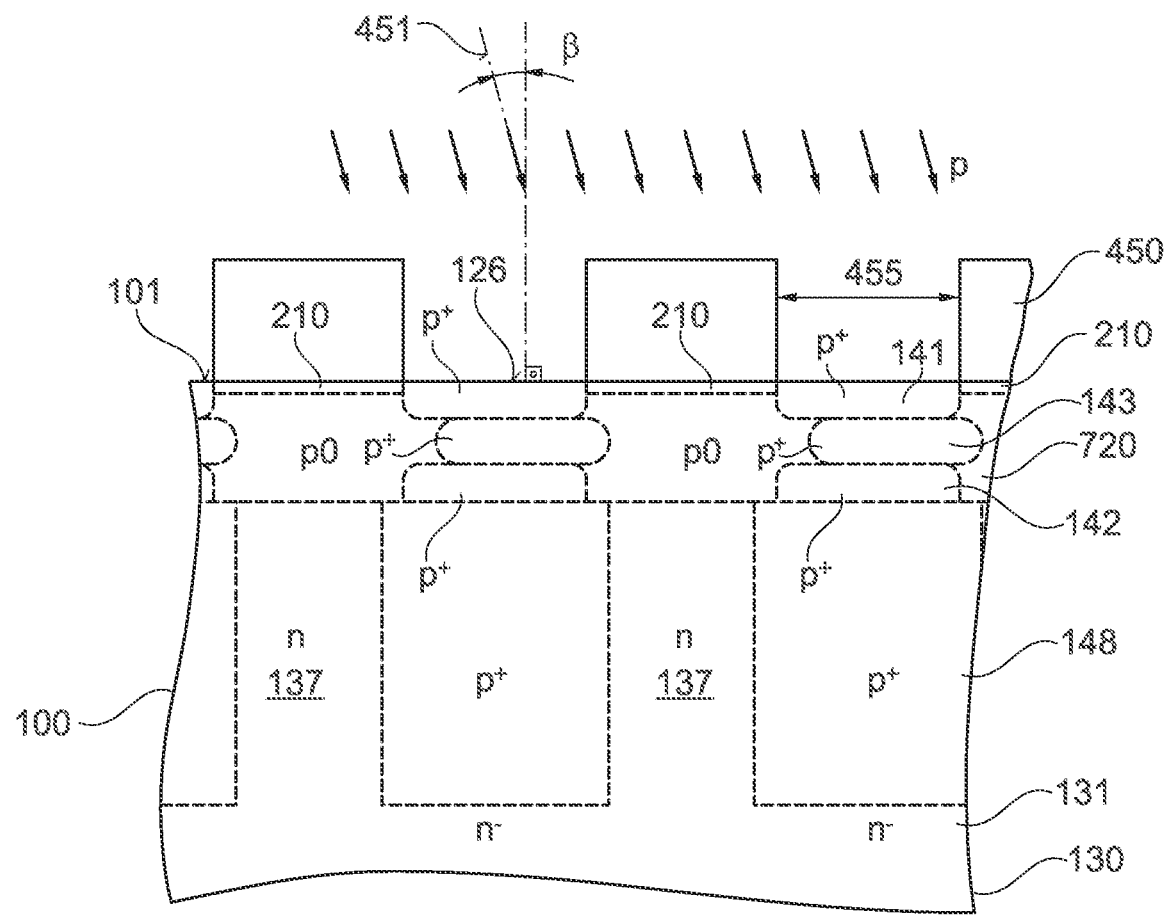
FIGS. 2A-2B show schematic vertical cross-sectional views of a portion of a silicon carbide body for illustrating a method of manufacturing a silicon carbide device according to an embodiment using a tilted implant.
Figure 2B:
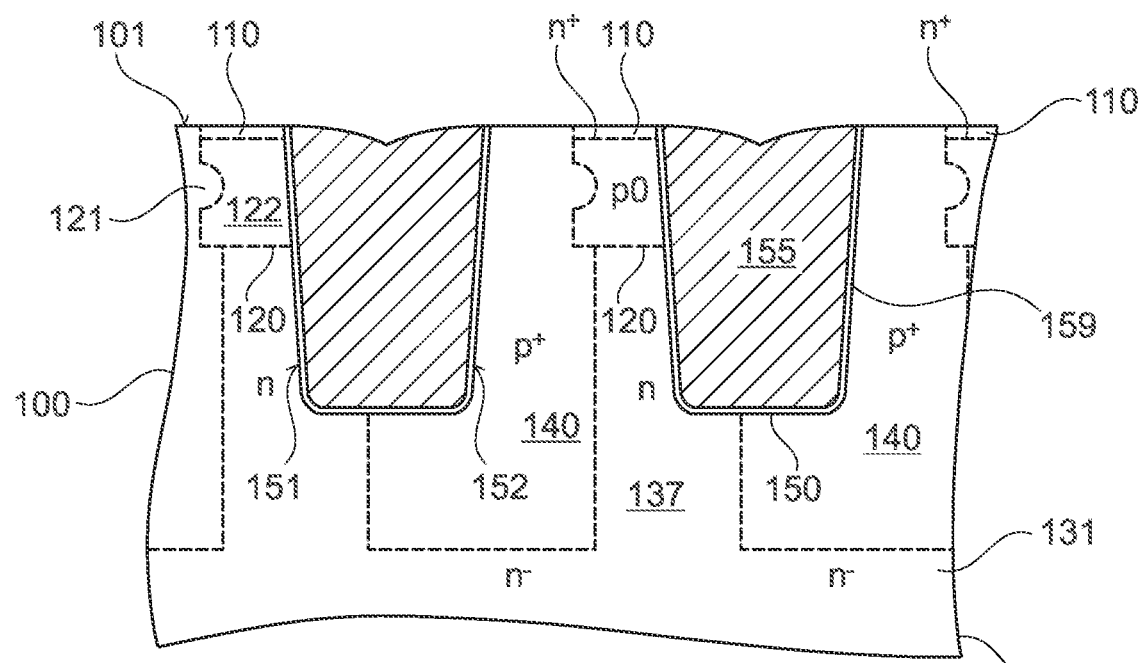

In FIGS. 2A and 2B a tilted implant forms at least a part of the first body portion 121.

FIG. 2A shows a body layer 720 between the first surface 101 and the current spread regions 137. The body layer 720 may directly adjoin the current spread regions 137. The body layer 720 may also be formed between the body contact areas 126 and deep shielding portions 148, wherein the deep shielding portions 148 laterally separate neighboring current spread regions 137. The body layer 720 may form a laterally continuous layer. Forming the body layer 720 may include unmasked implants, p-type epitaxy or a combination of both. Between neighboring body contact areas 126 source zones 210 may be located between the first surface 101 and the body layer 720.

A body enhancement implant mask 450 includes openings 455 that exclusively expose the body contact areas 126. In other words, the body enhancement implant mask 450 completely covers the source zones 210, in which n-doped source regions may be already formed or may be formed at a later stage.

The body enhancement implant mask 450 may mask one, two or more implants at different implantation energies, wherein the implants may be performed at different implantation angles. For example, a first orthogonal implant at a first implantation energy may form doped first partial regions 141 close to the first surface 101. A second orthogonal implant at a second implantation energy may form doped second partial regions 142 at a greater distance to the first surface 101. The second partial regions 142 may be in contact or may overlap with the deep shielding portions 148.

A tilted implant with an implant axis 451 tilted to the vertical direction 104 by an implant angle β and an implantation energy which is greater than the first implantation energy and smaller than the second implantation energy may form doped third partial regions 143 between the first and the second partial regions 141, 142. Due to the implant angle β, the third implant regions 143 are formed asymmetrically with respect to a center of the openings 455 in the body enhancement implant mask 450.

Deep implants, which may use the implant mask 450, an implant mask from which the body enhancement implant mask 450 is derived, for example, by a lateral recess, or an implant mask derived from the body enhancement implant mask 450, e.g., by a lateral recess, may be used to mask further implants of p-type dopants with higher implantation energies to form the deep shielding portion 148. The deep shielding portion 148 may be formed prior to or after forming the first, second and third partial regions 141, 142, 143. The body enhancement implant mask 450 may be removed and trench gate structures 150 may be formed as described with respect to FIGS. 1A-1C.

FIG. 2B shows a body region 120 with a first body region 121 forming a bulge extending from the shielding region 140 into the body region 120, wherein a maximum lateral extension of the bulge may be located a distance to the source region 110, at a distance to the drift structure 130 or spaced from both of them. Below the body contact areas 126, the first, second and third partial regions 141, 142, 143 and the deep shielding portion 148 form a continuous shielding region 140 as described above.

Figure 3A:
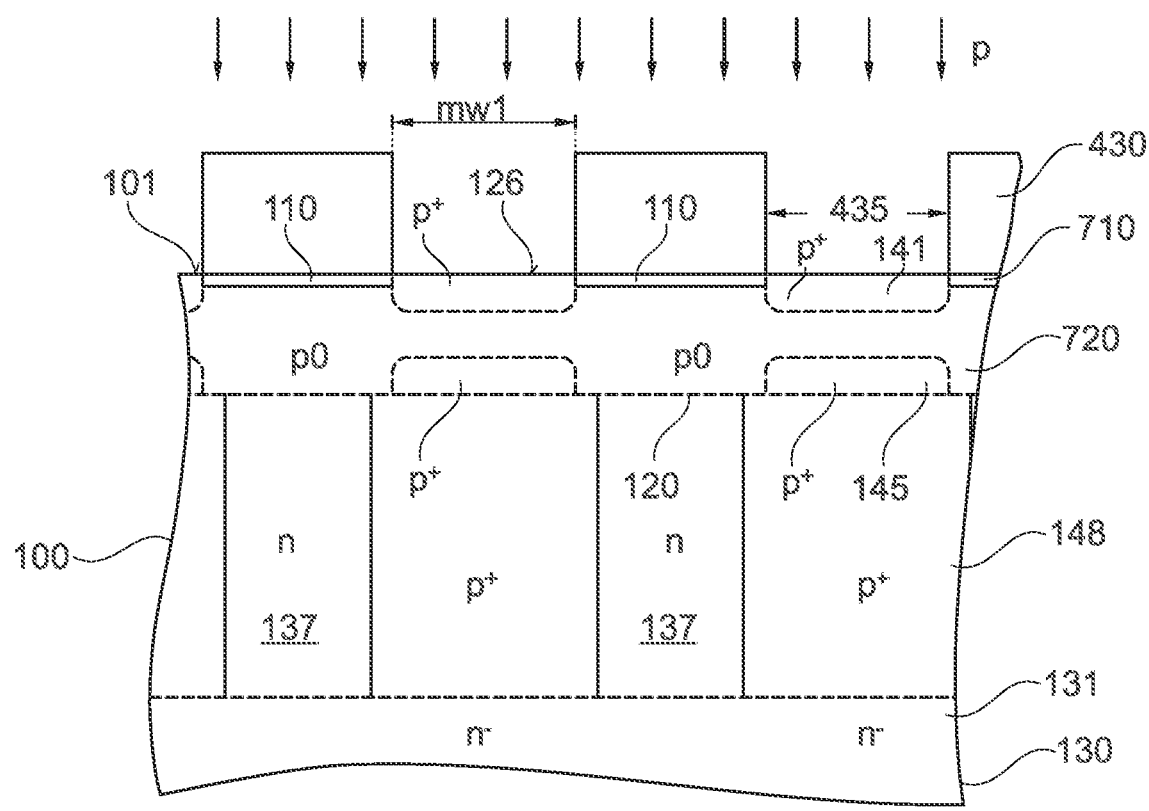
FIGS. 3A-3C show schematic vertical cross-sectional views of a portion of a silicon carbide body for illustrating a method of manufacturing a silicon carbide device according to an embodiment using a laterally recessed implant mask.
Figure 3B:
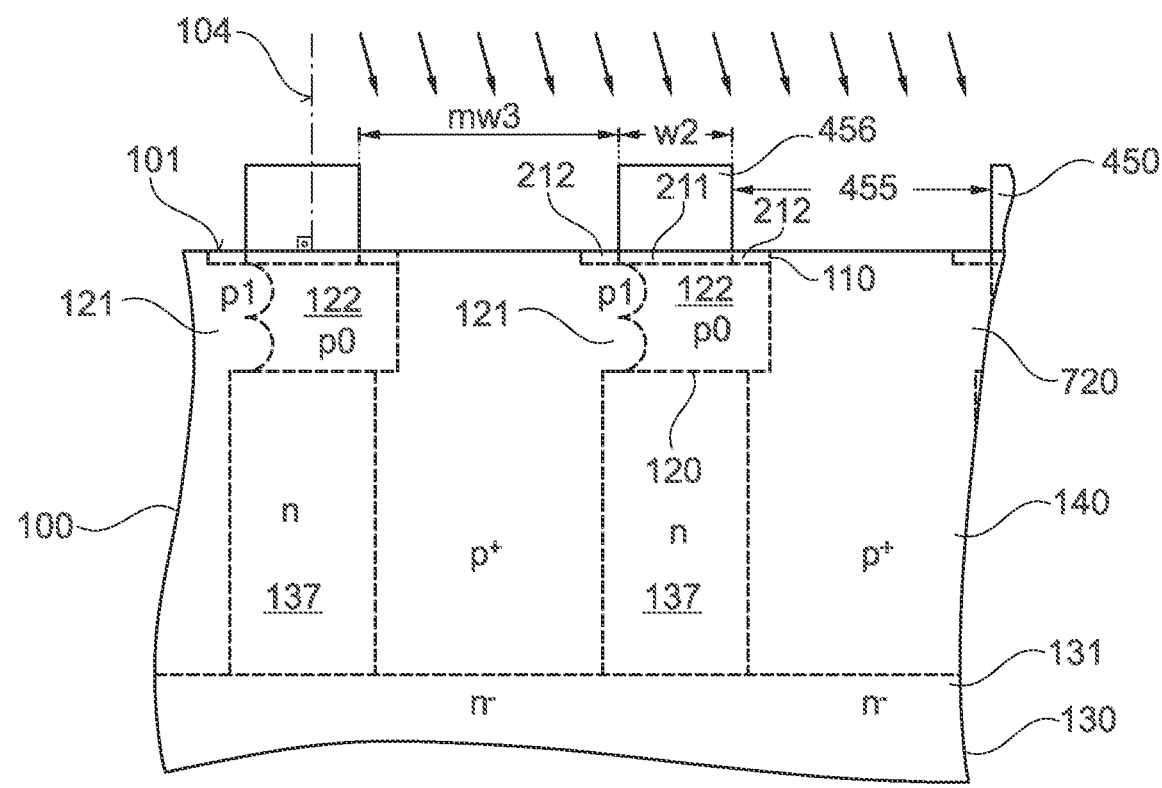
Figure 3C:
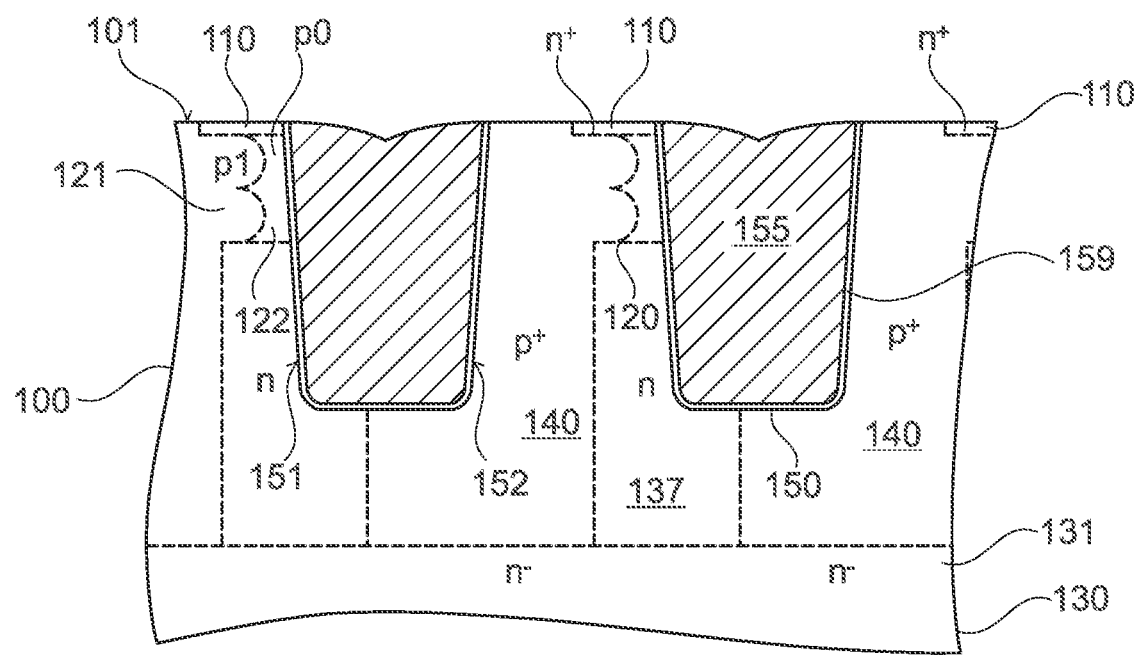

FIGS. 3A to 3C refer to a method that forms a body enhancement implant mask by laterally recessing a previously used implant mask.

FIG. 3A shows a silicon carbide body 100 with a lightly n doped drift zone 131 and p doped body layer 720. N doped current spread regions 137 may extend from the body layer 720 to the drift zone 131. P doped deep shielding portions 148 may laterally separate neighboring current spread regions 137. A heavily n doped source layer 710 may be formed between the first surface 101 and the body layer 720. The source layer 710 and/or the deep shielding portions 148 may also be formed at a later stage.

A body contact implant mask 430 is formed on the first surface 101. The body contact implant mask 430 includes mask openings 435 with a first mask opening width mw1. The mask openings 435 have a longitudinal extension orthogonal to the cross-sectional plane and are formed above the deep shielding portions 148. P-type dopants are implanted at comparatively low implantation energy and with comparatively high implant dose to form doped first partial regions 141 along the first surface 101, wherein the first partial regions 141 later form contact regions of shielding regions and/or body regions 120.

The implant may be vertical or only slightly tilted to the vertical direction 104, e.g. at an implant angle of less than 3° in absolute value. At least one further orthogonal or only slightly tilted implant may be performed at higher implantation energy to form doped buried partial regions 145.

The heavily doped first partial regions 141 directly adjoin body contact areas 126 of the first surface 101. A dopant concentration of the first partial regions 141 is sufficiently high to form low-resistive ohmic contacts between the first partial regions 141 and a metal structure that is formed on the first surface 101 at a later stage.

The further orthogonal or only slightly tilted implants may form buried partial regions 145 approximately in a vertical projection of the first partial regions 141. The buried partial regions 145 may be spaced from the first partial regions 141 as illustrated or may be in contact with the first partial regions 141. The buried partial regions 145 may extend into the deep shielding portions 148. Due to lateral straggling of the implanted ions the lateral extension of the buried partial regions 145 may increase with increasing distance to the first surface 101. Portions of the source layer 710 covered by the body contact implant mask 430 form source regions 110.

FIG. 3B shows a body enhancement implant mask 450 formed by laterally recessing the body contact implant mask 430 of FIG. 3A, wherein a third mask opening width mw3 of stripe-shaped openings 455 in the body enhancement implant mask 450 is greater than the first mask opening width mw2 of FIG. 3A.

For example, the body enhancement implant mask 450 may be formed by a wet etch that laterally recesses the body contact implant mask 430 of FIG. 3B. In addition to the body contact areas 126, the openings 455 expose second source portions 212 of the source regions 110, wherein the second source portions 212 directly adjoin the body contact areas 126.

The body enhancement implant mask 450 includes mask bars 456 with a width w3. The mask bars 456 cover first source portions 211 of the source regions 110. P-type dopants are implanted through the openings 455 along an implant axis that is tilted to the vertical direction 104 at an implant angle of at least 3°, or even at least 10°, in absolute value. The p-type dopants may be implanted at one, two or more different implantation energies that result in implant peaks at a distance to the first surface 101 and between the source regions 110 and the current spread regions 137. The implanted dopants form first body portions 121 in the body layer 720. Sections of the body layer 720 of FIG. 3A below the source regions 110 and unaffected by the tilted implant form second body portions 122 of body regions 120.

Below the body contact areas 126, the first partial region 141 of FIG. 3A, the buried partial region 145 of FIG. 3A, the deep shielding portion 148 of FIG. 3A, and dopants implanted by the tilted implant directly below the body contact areas 126 form continuous shielding regions 140. Along a vertical line, the dopant type of the shielding regions 140 is continuously the p-type. The net dopant concentration along the vertical line may include several local maxima and local minima.

The process may continue with forming trench gate structures 150 as described with reference to the previous figures.

As shown in FIG. 3C a lateral extension of the first body portion 121 is defined by the width of the second source portions 212 of FIG. 3B, the implant angle of the tilted implant(s) and the implant energy of the tilted implant(s).

FIGS. 4A to 4D illustrate a method that uses one single photolithographic process for defining different doped regions of the same conductivity type at the front side of a silicon carbide device.

Figure 4A:
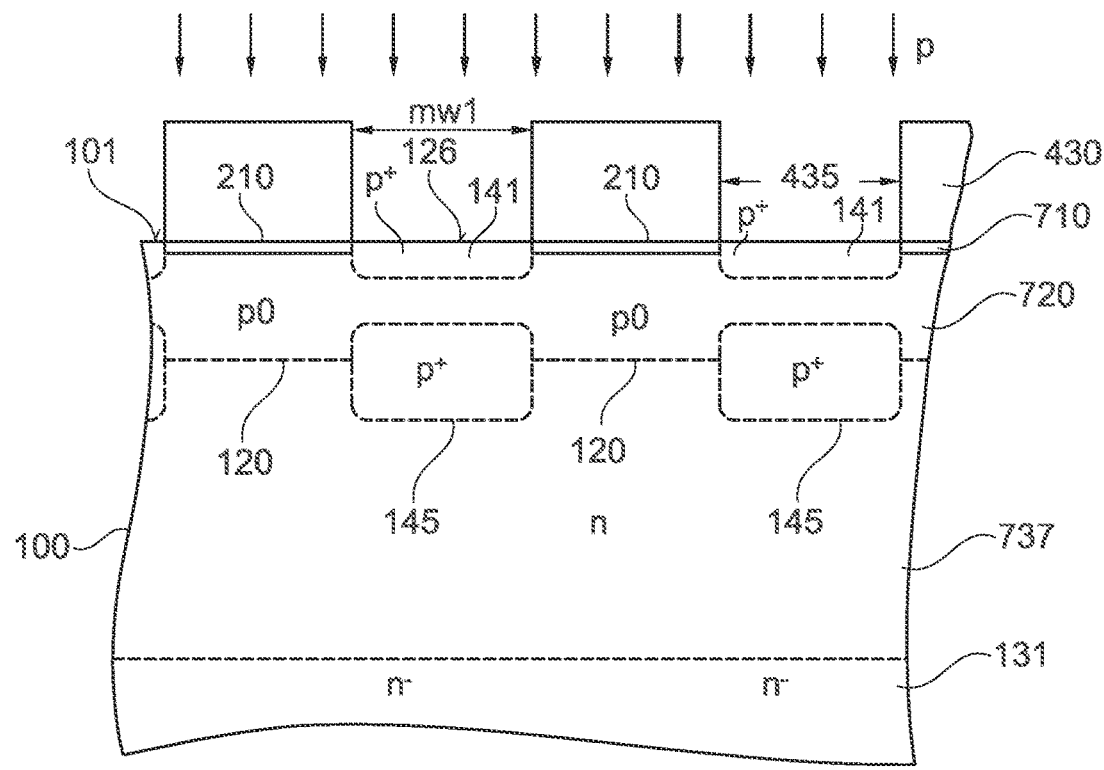
FIGS. 4A-4D show schematic vertical cross-sectional views of a portion of a silicon carbide body for illustrating a method of manufacturing a silicon carbide device according to an embodiment using more than one implant mask recess.

FIG. 4A shows a silicon carbide body 100 with a lightly n-doped drift zone 131. An n-doped current spread layer 737 is located between the first surface 101 and the drift zone 131 and is in contact with the drift zone 131. A body layer 720 between the first surface 101 and the current spread layer 737 may be in direct contact with the current spread layer 737. A source layer 710 between the first surface 101 and the body layer 720 may be in direct contact with the body layer 720 and the first surface 101.

A body contact implant mask 430 is formed on the first surface 101. P-type dopants are implanted through mask openings 435 with a first mask opening width mw1 as described with reference to FIG. 3A.

FIG. 4A shows the heavily doped first partial regions 141 in contact with the body contact areas 126 and doped buried partial regions 145 that may extend into the current spread layer 737.

A deep implant mask 440 may be formed on the first surface 101, wherein a second mask opening width mw2 of stripe-shaped second mask openings 445 in the deep implant mask 440 is greater than the first mask opening width mw1 of FIG. 4A.

For example, the deep implant mask 440 may be formed by at least laterally recessing the body contact implant mask 430 of FIG. 4A. In addition to the body contact areas 126, the second mask openings 445 expose fourth source portions 214 of source zones 210, wherein the fourth source portions 214 directly adjoin the body contact areas 126. Sections of the deep implant mask 440 cover third source portions 213 of source zones 210. P-type dopants are implanted through the second mask openings 445 to form heavily doped deep shielding portions 148 in the current spread layer 737.

Figure 4B:
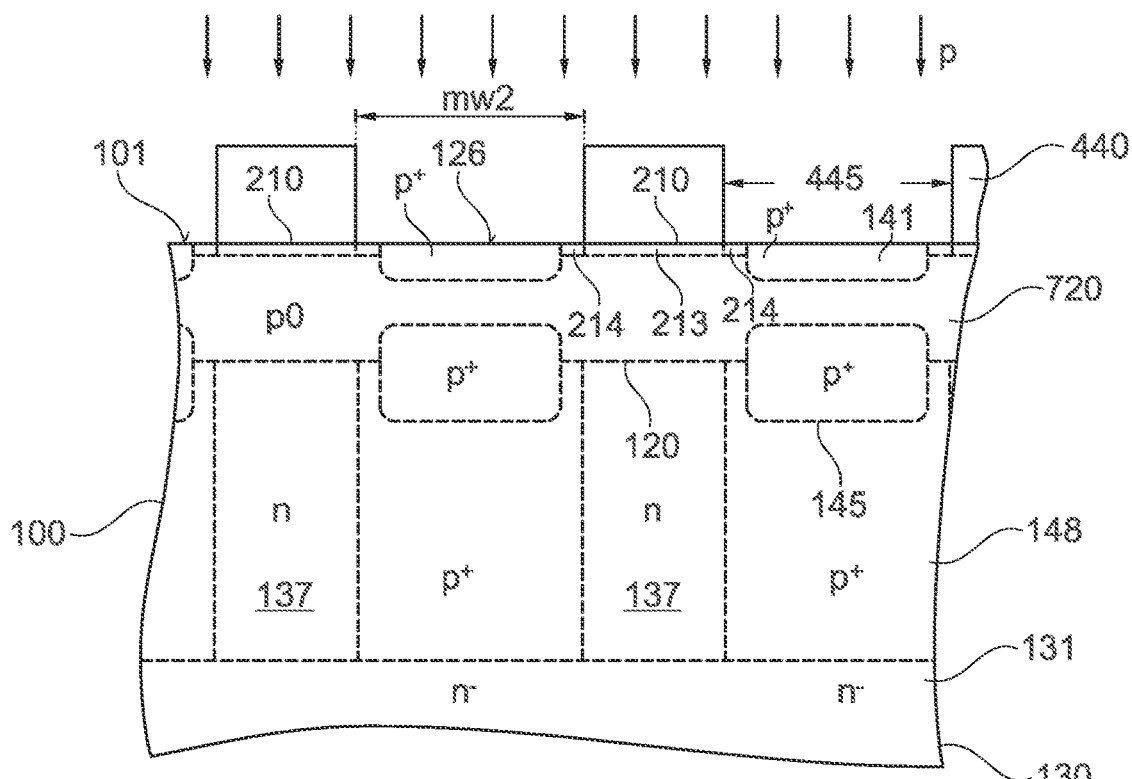

According to FIG. 4B each deep shielding portion 148 may extend from the body layer 720 to the drift zone 131. Portions of the current spread layer 737 of FIG. 4A between neighboring deep shielding portions 148 form n-doped current spread regions 137. According to another example, the deep shielding portion 148 remains spaced from the drift zone 131 and residuals of the current spread layer 737 of FIG. 4B may be left between the deep shielding portions 148 and the drift zone 131.

The deep implant mask 440 of FIG. 4B may be used as body enhancement implant mask 450 as described with reference to FIGS. 2A-2B.

Figure 4C:
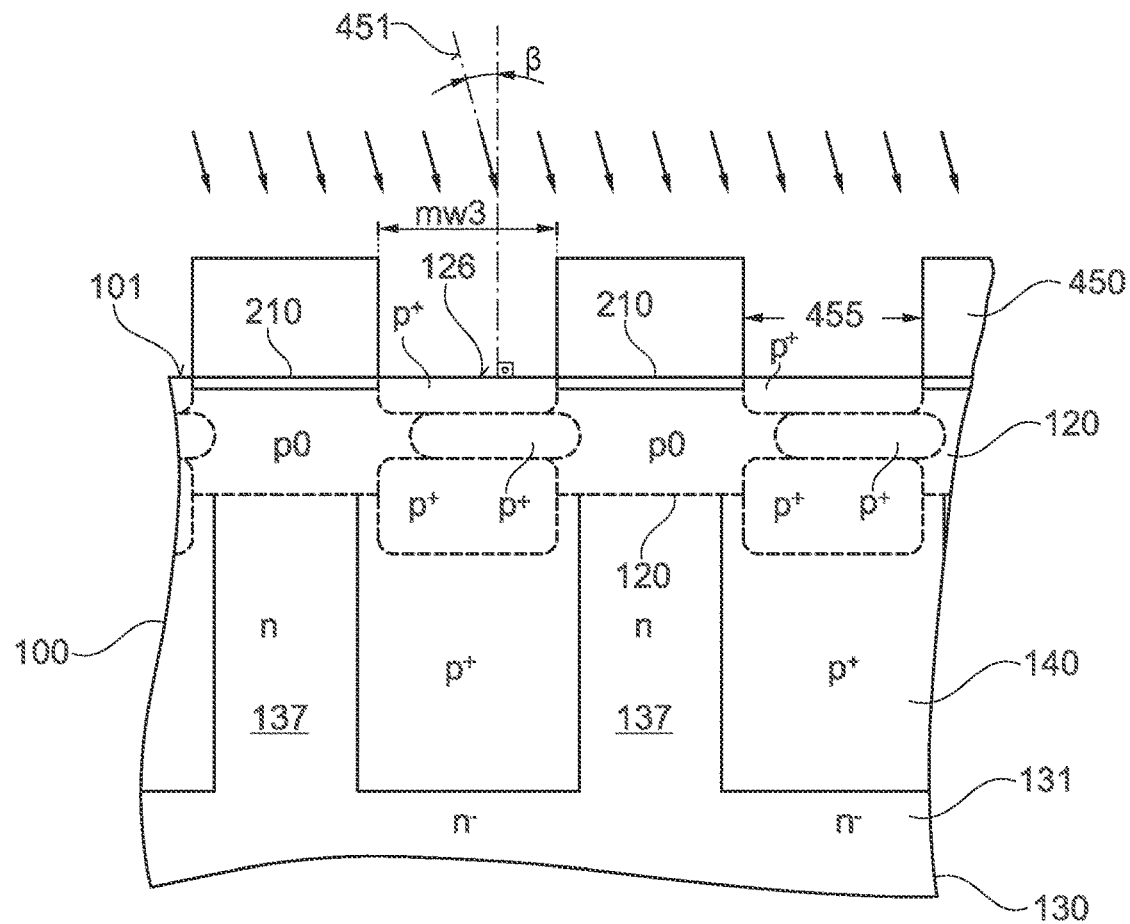

Alternatively, as illustrated in FIG. 4C the body enhancement implant mask 450 is formed by further laterally recessing the deep implant mask 440 of FIG. 4B, wherein a third mask opening width mw3 of stripe-shaped openings 455 in the body enhancement implant mask 450 is greater than the second mask opening width mw2 of FIG. 4B.

For example, the body enhancement implant mask 450 may be formed by at least laterally recessing the deep implant mask 440 of FIG. 4B. In addition to the body contact areas 126, the openings 455 expose second source portions 212, wherein the second source portions 212 directly adjoin the body contact areas 126 and are wider than the fourth source portions 214 of FIG. 4B. Sections of the body enhancement implant mask 450 cover first source portions 211. P-type dopants are implanted through the openings 435, wherein the implant axis is tilted to the vertical direction 104. The p-type dopants may be implanted at one, two or more different implantation energies.

Below the body contact areas 126, the first partial region 141 of FIG. 4C, the buried partial region 145 of FIG. 4C, the deep shielding portion 148 of FIG. 4C, and the dopants the tilted implant implants directly below the body contact areas 126 form continuous shielding regions 140 as described above. The process may continue with forming trench gate structures 150 as described with reference to the previous figures.

Figure 4D:
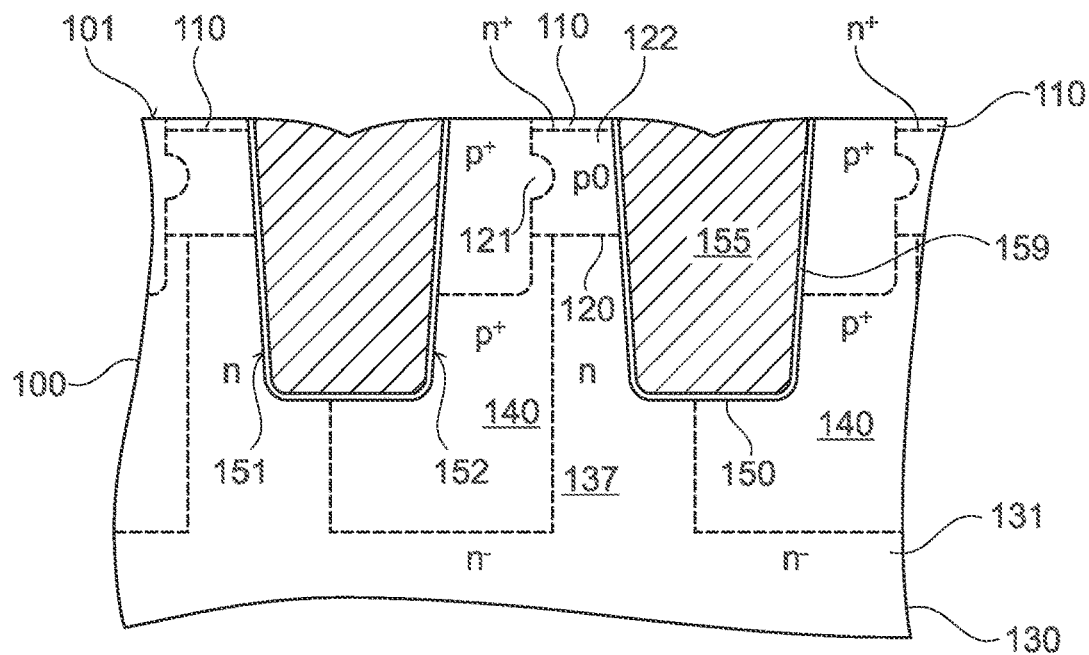

FIG. 4D shows body regions 120 with first body regions 121 that form wide bulges extending from the shielding regions 140 over at least 50% of a lateral width of the source region 110 into the body region 120 into direction of the trench gate structures 150. A maximum lateral extension of the bulges may be located a distance to the source region 110, at a distance to the drift structure 130 or spaced from both of them.

The method as described with any of FIGS. 1A and 1B, 2A and 2B, 3A to 3C, and 4A to 4D may be used to form any of the silicon carbide devices 500 as described with reference to FIGS. 5A and 5B, 6A and 6B and 8A and 8B. Any of the silicon carbide devices 500 described with reference to FIGS. 5A and 5B, 6A and 6B, and 8A and 8B may be obtained by any of the methods described with reference to FIGS. 1A and 1B, 2A and 2B, 3A to 3C, and 4A to 4D.

Figure 5A:
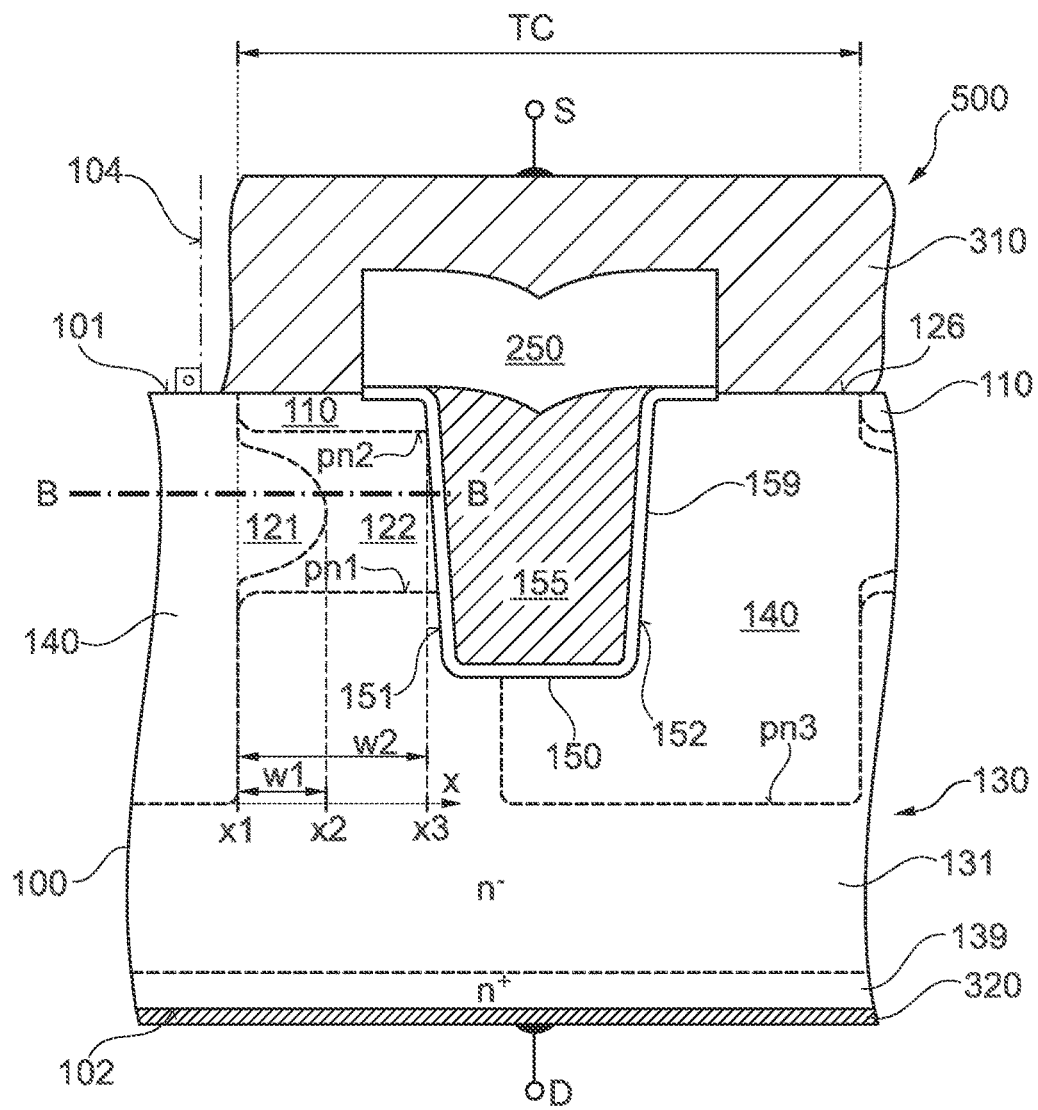
FIG. 5A shows a schematic vertical cross-sectional view of a portion of a silicon carbide device with heavily doped body portion according to another embodiment.
Figure 5B:
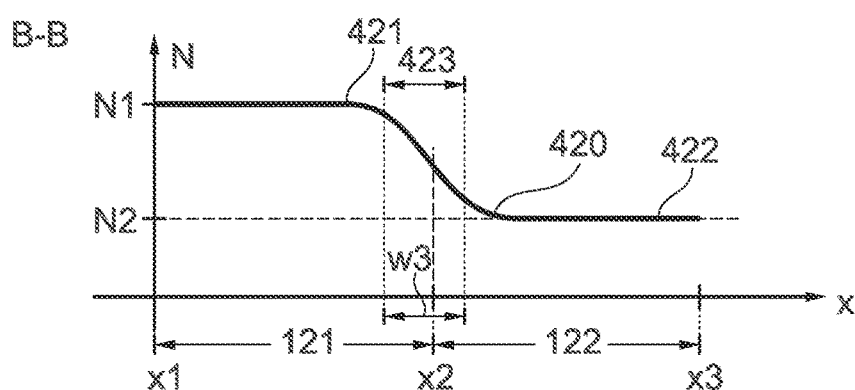
FIG. 5B shows a schematic diagram for illustrating a horizontal dopant gradient in the body region of FIG. 5A.

FIGS. 5A and 5B refer to a silicon carbide device 500 including transistor cells TC. The silicon carbide device 500 includes a silicon carbide body 100 that may be embodied as described above in connection with FIGS. 1A to 4D.

The transistor cells TC are formed along stripe-shaped trench gate structures 150 that extend from the first surface 101 into the silicon carbide body 100. The trench gate structures 150 may be long stripes extending along a longitudinal direction through an active region of the silicon carbide device 500. In other embodiments, the trench gate structures 150 may, e.g., be hexagonal or quadratic. Portions of the silicon carbide body 100 between neighboring trench gate structures 150 form SiC mesas.

The drift structure 130 may include a lightly doped drift zone 131 of a first conductivity type and a heavily doped contact portion 139 of the first conductivity type between the drift zone 131 and the second surface 102.

The heavily doped contact portion 139 may be or may include a substrate portion obtained from a crystalline ingot or may include a heavily doped portion of a layer formed by epitaxy. Along the second surface 102, a dopant concentration in the contact portion 139 is sufficiently high to ensure a low-resistive ohmic contact between the contact portion 139 and a second load electrode 320.

The drift zone 131 may be formed in a layer grown by epitaxy. A mean net dopant concentration in the drift zone 131 may be in the range from $1E15$ cm$^{-3}$ to $5E16$ cm$^{-3}$. The drift zone 131 may directly adjoin the contact portion 139. Alternatively, a buffer layer forming a unipolar junction with the drift zone 131 may be located between the drift zone 131 and the contact portion 139, wherein a vertical extension of the buffer layer may be approximately 1 μm and wherein a mean dopant concentration in the buffer layer may be in a range from $3E17$ cm$^{-3}$ to $1E18$ cm$^{-3}$, by way of example.

The trench gate structures 150, which extend from the first surface 101 into the silicon carbide body 100, include a conductive gate electrode 155 that may include or consist of a heavily doped polycrystalline silicon layer and/or a metal-containing layer. The gate electrode 155 may be electrically connected to a gate metallization that forms or that is electrically connected or coupled to a gate terminal.

A gate dielectric 159 separates the gate electrode 155 from the silicon carbide body 100 along at least one side of the trench gate structure 150. The gate dielectric 159 may include or consist of thermally grown or deposited silicon oxide, silicon nitride, silicon oxynitride, another deposited dielectric material or any combination thereof. A thickness of the gate dielectric 159 may be selected to obtain transistor cells TC with a threshold voltage in a range from 1.0 V to 8 V. The trench gate structures 150 may exclusively include the gate electrode 155 and the gate dielectric 159 or may include further conductive and/or dielectric structures in addition to the gate electrode 155 and the gate dielectric 159.

The trench gate structures 150 are stripe-shaped. That is to say: a length of the trench gate structures 150 along the lateral first direction is greater than a width of the trench gate structures 150 along a lateral second direction orthogonal to the first direction.

The trench gate structures 150 may be equally spaced, may have equal width, and may form a regular stripe pattern, wherein a center-to-center distance between the trench gate structures 150 may be in a range from 1 μm to 10 μm, e.g., from 2 μm to 5 μm. A length of the trench gate structures 150 may be up to several millimeters. A vertical extension of the trench gate structures 150 may be in a range from 0.3 μm to 5 μm, e.g., in a range from 0.5 μm to 2 μm. At the bottom, the trench gate structures 150 may be rounded.

Opposing sidewalls of each of the trench gate structures 150 may run essentially along the vertical direction 104 or may be tilted with respect to the vertical direction 104 by a taper angle. In the latter case, the trench gate structure 150 may taper with increasing distance to the first surface 101. The taper angle between the sidewalls and the vertical direction 104 at the first surface may be chosen according to the alignment of the crystal axes and/or according to the off-axis angle. For example, the absolute value of the taper angle between a first sidewall and the vertical direction may deviate from the absolute value of the off-axis angle by not more than ±1° (e.g., in the case of 4H-SiC may range from at least 3° to at most 5°). The taper angle may, however, deviate from the off-axis angle in orientation. The taper angle between a second sidewall, which is opposite the first sidewall, and the vertical direction may be oriented opposite the taper angle of the first sidewall. The larger the taper angle, the narrower the gate trench structure 150 becomes starting from the first surface.

In general, at least the first sidewall of the trench gate structure 150 may run essentially along a crystal plane of the silicon carbide body in which charge carrier mobility is high (e.g., one of the {11-20} or the {1-100} crystal planes). The first sidewall may be the active sidewall, that is to say, the channel region may run along the first sidewall. In some embodiments, the second sidewall may also be an active sidewall (e.g., in the case of a vertical trench gate structure 150). In other embodiments, the second sidewall may be an inactive sidewall.

Each SiC mesa between neighboring trench gate structures 150 includes a source region 110, a body region 120 and at least a portion of a shielding region 140. The source region 110 is between the first surface 100 and the body region 120 and is in direct contact with the active sidewall 151 of the trench gate structure 150.

The body region 120 separates the source region 110 and the drift structure 130. The body region 120 and the drift structure 130 form a first pn junction pn1. The body region 120 and the source region 110 form a second pn junction pn2. The body region 120 directly adjoins the active sidewall 151 of the first trench gate structure 150. A vertical extension of the body region 120 corresponds to a channel length of the transistor cells TC and may be in a range from 0.2 μm to 1.5 μm.

A first load electrode 310 at a front side of the silicon carbide body 100 is electrically connected with the source region 110 and the body region 120. Stripe-shaped portions of an interlayer dielectric 250 separate the first load electrode 310 and the gate electrode 155 in the trench gate structures 150. The first load electrode 310 may form or may be electrically connected with or coupled to a first load terminal, which may be an anode terminal of an MCD or a source terminal S of an MOSFET.

The second load electrode 320, which forms a low-resistive ohmic contact with the contact portion 139, may form or may be electrically connected with or coupled to a second load terminal, which may be a cathode terminal of an MCD or a drain terminal D of an MOSFET.

First portions of the shielding region 140 are arranged between the body regions 120 and the inactive sidewalls 152 of the trench gate structures 150. Second portions of the shielding regions 140 may vertically overlap with the second trench gate structures 150. In other words, the second portions of the shielding regions 140 are formed directly below the trench gate structures 150, e.g., between the trench gate structures 150 and the second surface 102. The shielding region 140 is electrically connected or coupled to the first load electrode 310.

A maximum dopant concentration in the shielding region 140 may be higher than a maximum dopant concentration in the body region 120. A vertical dopant concentration profile in the shielding region 140 may have a local maximum at a position below the trench gate structure 150. Along the inactive sidewall 152 a dopant concentration in the shielding region 140 may be higher, i.e., at least ten times higher than a dopant concentration in the body region 120 along the active sidewall 151.

The shielding region 140 and the drift structure 130 form a third pn junction pn3 that may provide the silicon carbide device 500 with integrated fly-back diode functionality. In addition, in a blocking state of the silicon carbide device 500, the second portion of the shielding region 140 below the trench gate structure 150 may shield an active portion of the gate dielectric 159 along the active sidewall 151 against a potential applied to the second load electrode 320.

The illustrated silicon carbide device 500 is an re-channel SiC-TMOSFET, wherein the first load electrode 310 forms or is electrically connected or coupled to a source terminal S and wherein the second load electrode 320 forms or is electrically connected or coupled to a drain terminal D. The silicon carbide device 500 includes a plurality of transistor cells TC and a plurality of trench gate structures 150 as illustrated in FIG. 5A. The trench gate structures 150 are stripe-shaped with a longitudinal axis orthogonal to the cross-sectional plane.

The body region 120 of a transistor cell TC includes a first body portion 121 and a second body portion 122 that separates the first body portion 121 from the adjoining trench gate structure 150.

FIG. 5B shows a horizontal dopant gradient 420 along line B-B through the body region 120 of FIG. 5A. On the abscissa, x1 refers to the position of the lateral pn junction between source region 110 and shielding region 140. x2 indicates the position of the unipolar junction between the first body portion and the second body portion. x2 marks the position of the active sidewall. w3 marks the lateral extension of a transition region 423 between the first body portion and the second body portion.

The horizontal dopant gradient 420 through the body region 120 includes a first section 421, in which the horizontal dopant gradient is approximately constant, and includes a second section 422, in which the horizontal dopant gradient is approximately constant but significantly lower than in the first section 421. The first section 421 corresponds to the first body portion 121 and directly adjoins the shielding region 140. The second section 422 corresponds to the second body portion 122 and directly adjoins the trench gate structure 150. In the horizontal plane defined by cross-sectional line B-B a horizontal extension w1 of the first body portion 121 is at least 20% of a total horizontal extension w0 of the body region 120.

A mean dopant concentration N1 in the first section 421 is at least ten times as high as a mean dopant concentration N2 in the second section 422. Within the transition region 423 between the first body portion and the second body portion, the mean dopant concentration N1 in the first section 421 is reduced to the mean dopant concentration N2 in the second section 422. The transition region 423 may start at 90% of the mean net dopant concentration of the first body portion and end at 110% of the reference dopant concentration and/or the mean net dopant concentration of the second body portion. The reduction of the mean dopant concentration within the transition region 423 may be comparatively steep. The lateral extension w3 of the transition region may be significantly smaller than a lateral extension of the source region 110. The mean dopant concentration N1 in the first body portion 121 may be equal or approximately equal to the dopant concentration in a directly adjoining portion of the shielding region 140.

Figure 6A:
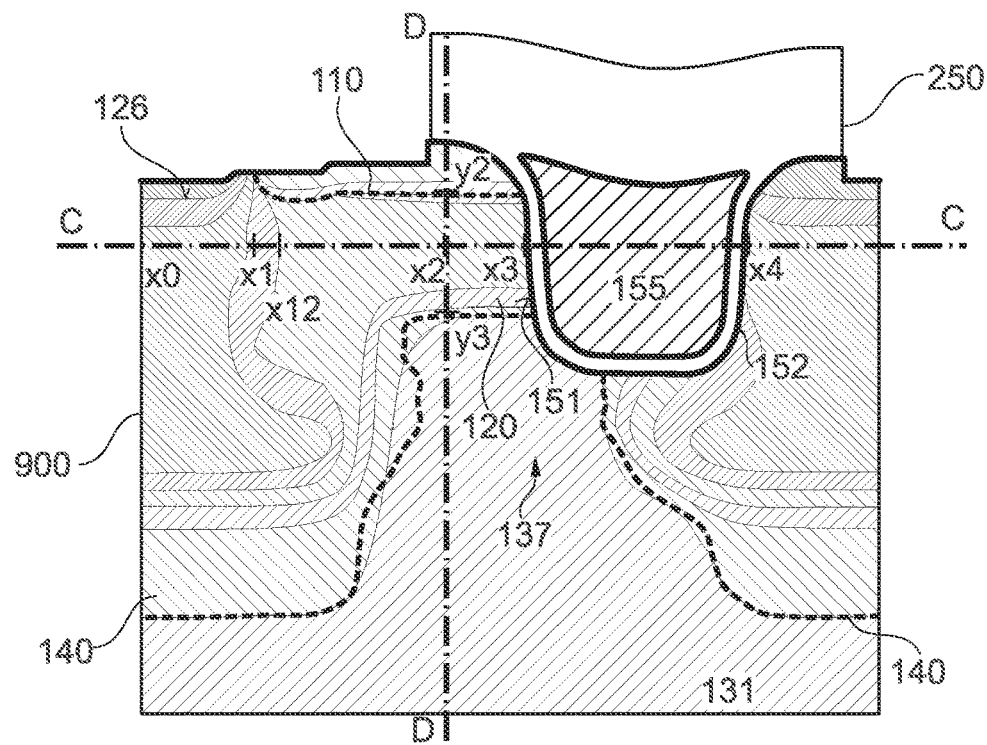
FIGS. 6A-6B show vertical cross-sectional views of a silicon carbide device according to an embodiment and of a comparative device.
Figure 6B:
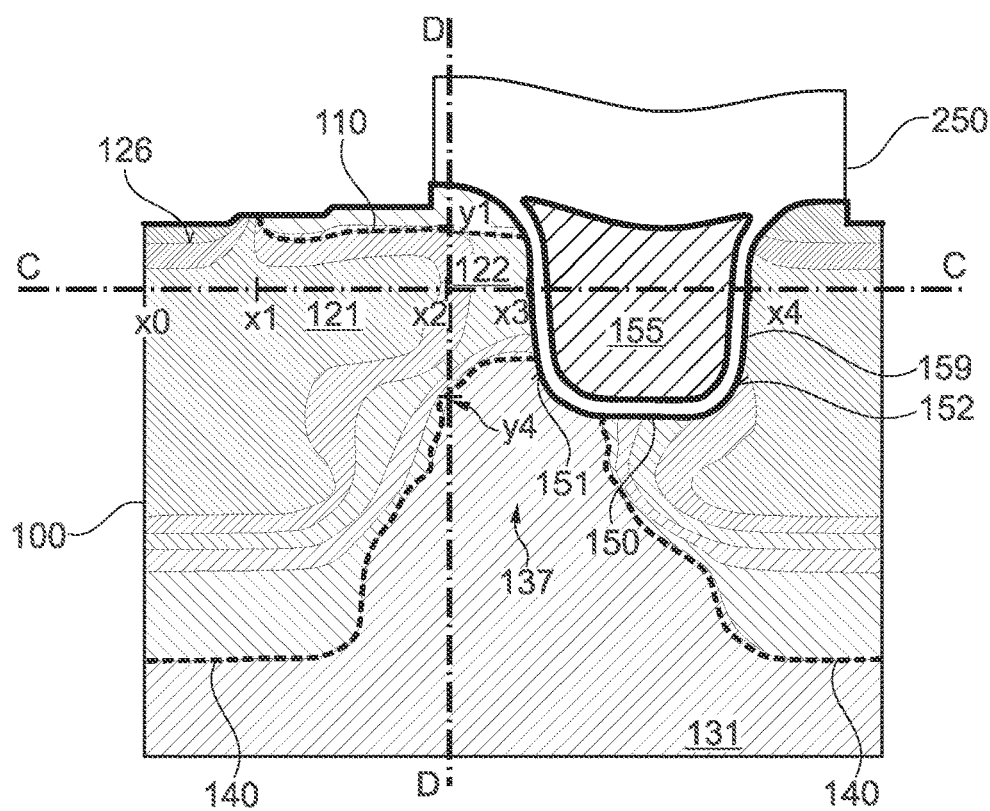

FIGS. 6A and 6B show corresponding cross-sectional views of portions of a silicon carbide body 900 according to a comparative example and of a silicon carbide body 100 according to an embodiment.

The comparative silicon carbide body 900 of FIG. 6A shows a laterally nearly uniformly doped body region 120 below the source region 110. In the silicon carbide body 100 of FIG. 6B the body region 120 includes a pronounced, comparatively heavily doped first body portion 121 and a comparatively lightly doped second body portion 122 between the first body portion 121 and the trench gate structure 150. The first body portion 121 extends across more than 50% of a lateral extension of the source region 110.

Figure 6C:
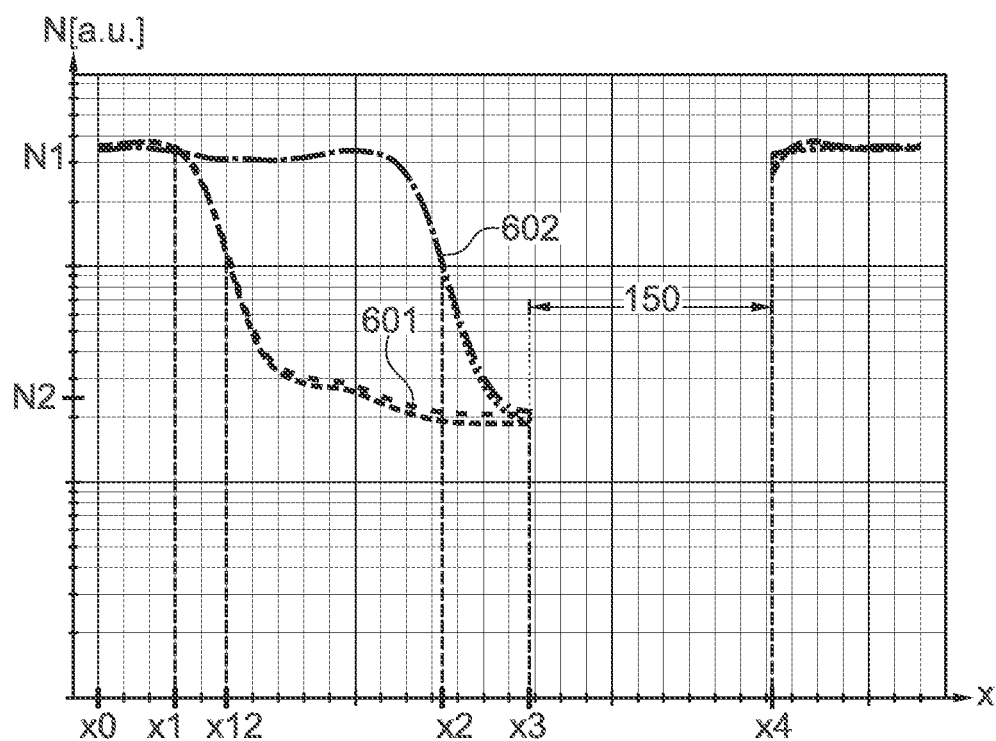
FIGS. 6C-6D show schematic diagrams illustrating horizontal and vertical dopant gradients in the silicon carbide device and in the comparative device of FIGS. 6A-6B for discussing effects of the embodiments.

In FIG. 6C the dashed line shows the horizontal dopant profile 601 along line C-C of FIG. 6A and the continuous line shows the horizontal dopant profile 602 along line C-C of FIG. 6B. On the abscissa, x1 refers to the position of the lateral pn junction between body contact area 126 and source region 110, x12 is the position of the junction between the shielding region 140 and the body region 120 in FIG. 6A, x2 is the position of the unipolar junction between the first and the second body portion 121, 122 in FIG. 6B. x3 and x4 mark the edges of the trench gate structure 150.

The dopant concentration N1 along the interface to the shielding region 140 may be, for example, in a range from $1E+17 \, cm^{-3}$ to $1E+19 \, cm^{-3}$, for example, in a range from $1E+18 \, cm^{-3}$ to $5E+18 \, cm^{-3}$. The dopant concentration of the second body portion 122 along the trench gate structure 150 may be at least one order of magnitude lower than in the shielding region 140. The area between lines 601 and 602 represents the additional charge available for compensation of the charge of the stationary charge carriers in a depletion region formed in the blocking mode.

Figure 6D:
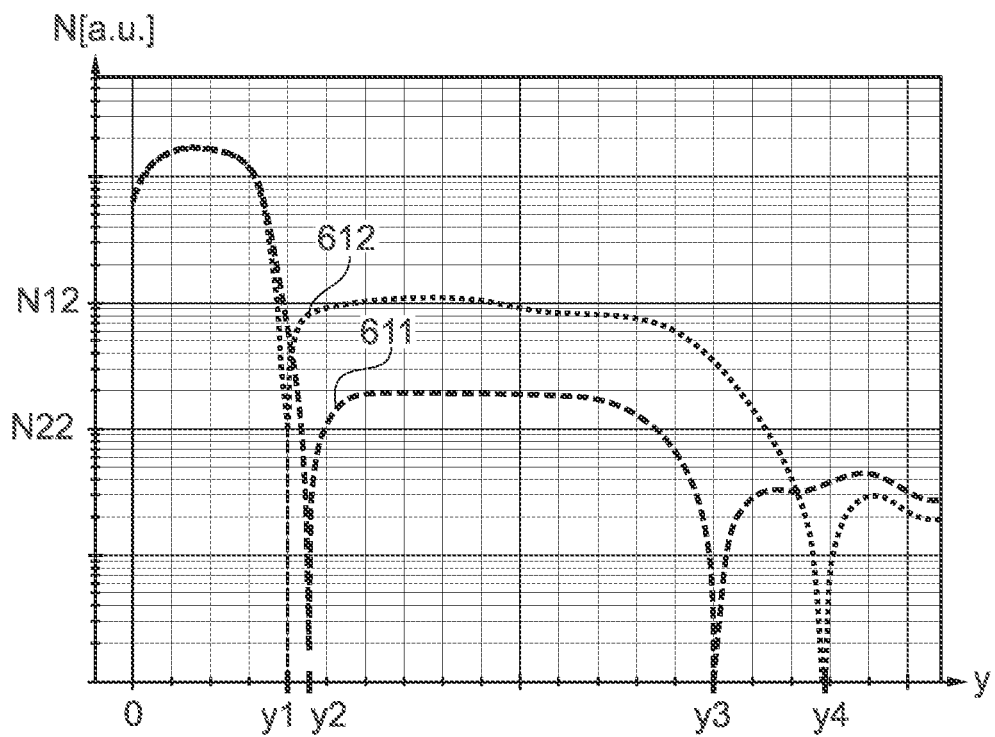

In FIG. 6D the dashed line shows the vertical dopant profile 611 along line D-D of FIG. 6A and the continuous line shows the vertical dopant profile 612 along line D-D of FIG. 6B. On the abscissa, y2 marks the position of the pn junction between source region 110 and body region 120 in FIG. 6A and y4 marks the position of the pn junction between body region 120 and current spread region 137 in FIG. 6A. y1 marks the position of the pn junction between source region 110 and first body portion 121 in FIG. 6B and y3 marks the position of the pn junction between first body portion 121 and current spread region 137 in FIG. 6B.

In the silicon carbide body 100 of FIG. 6B, two implants at different implantation energies are used to form the first body portion 121 with a comparatively constant vertical dopant profile 612, which across at least 60% of the vertical extension of the body region 120 shows dopant variations lower than 50% from a maximum value. A mean vertical extension of the first body portion 121 between y1 and y4 may be greater than a maximum vertical extension of the second body portion 122.

Figure 6E:
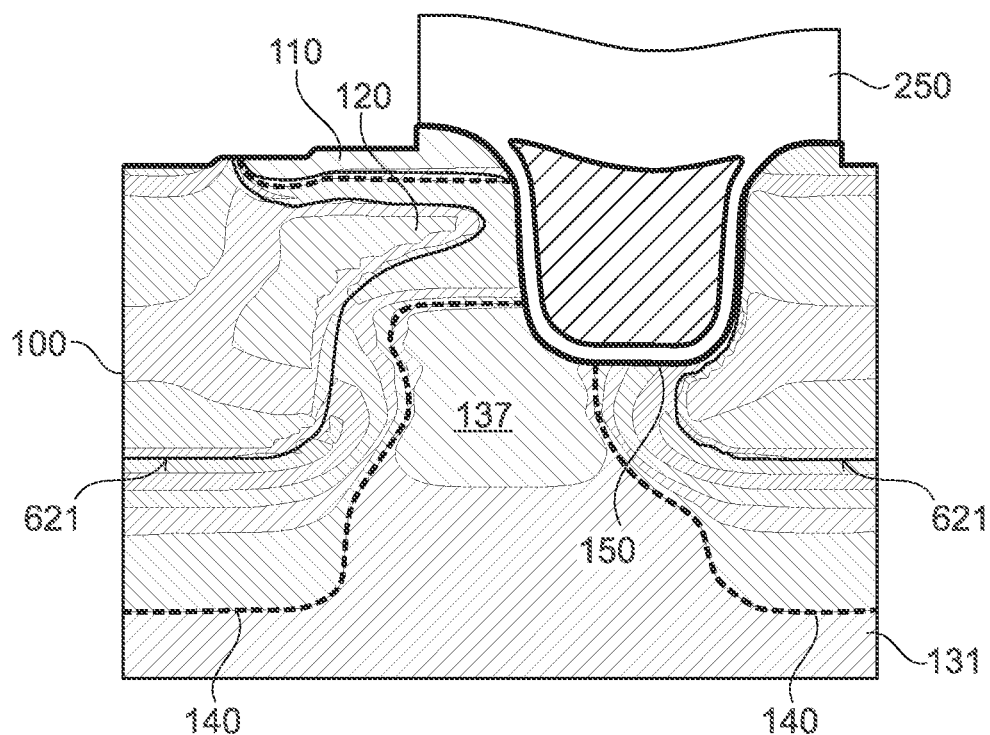
FIGS. 6E-6F show boundaries of depletion zones formed in the body regions of the silicon carbide device and the comparative device of FIGS. 6A-6B in a blocking mode for discussing effects of the embodiments.
Figure 6F:
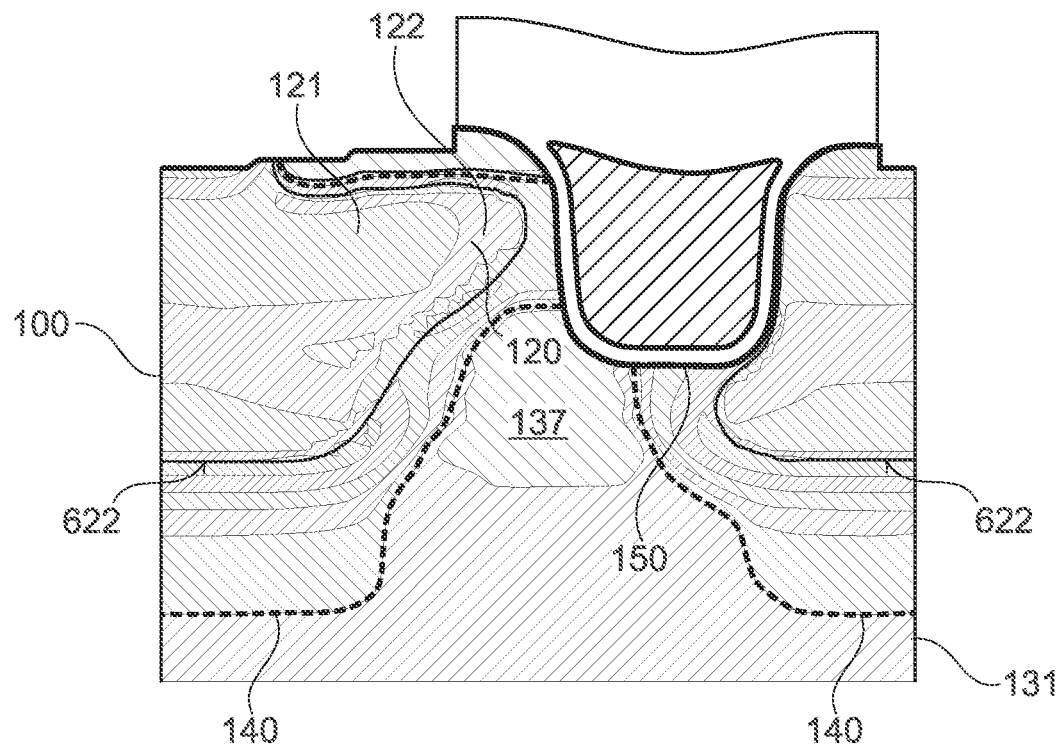

FIGS. 6E and 6F show the boundaries 621, 622 of a depletion region formed in the blocking mode of the silicon carbide devices 500 of FIGS. 6A and 6B at a reference blocking voltage.

Significant portions of the body region 120, which are depleted in the comparative example of FIG. 6A, are not depleted in the silicon carbide body 100 of FIG. 6B such that less stationary charge carriers need to be compensated by electrons that reduce the barrier height at the gate dielectric 159.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A silicon carbide device, comprising:
a silicon carbide body comprising a trench gate structure extending from a first surface into the silicon carbide body, a body region in contact with an active sidewall of the trench gate structure, a source region in contact with the active sidewall and located between the body region and the first surface, and a shielding region of a conductivity type of the body region,
wherein the shielding region extends from the first surface into the silicon carbide body,
wherein the shielding region laterally directly adjoins the source region and the body region,
wherein the shielding region is in contact with an inactive sidewall of a further trench gate structure,
wherein the body region comprises a first body portion directly below the source region and distant from the active sidewall,
wherein in at least one horizontal plane parallel to the first surface, a dopant concentration in the first body portion is at least 150% of a reference dopant concentration in the body region at the active sidewall,
wherein in the at least one horizontal plane parallel to the first surface, a horizontal extension of the first body portion is at least 20% of a total horizontal extension of the body region,
wherein in the at least one horizontal plane, a lateral dopant distribution in a portion of the shielding region directly adjoining the first body portion deviates by not more than ±10% from a dopant concentration in the first body portion.

2. The silicon carbide device of claim 1, wherein in the at least one horizontal plane, the horizontal extension of the first body portion is at least 50% of the total horizontal extension of the body region.

3. The silicon carbide device of claim 1, wherein the first body portion is formed by a masked tilted implant.

4. The silicon carbide device of claim 1, further comprising a body contact area laterally directly adjoining the source region.

5. The silicon carbide device of claim 1, wherein the first body portion forms a bulge extending from the shielding region into the body region, and wherein a maximum lateral extension of the bulge is located a distance to the source region.

6. A silicon carbide device, comprising:
a silicon carbide body comprising a trench gate structure extending from a first surface into the silicon carbide body, a body region in contact with an active sidewall of the trench gate structure, a source region in contact with the active sidewall and located between the body region and the first surface, and a shielding region of a conductivity type of the body region,
wherein the shielding region extends from the first surface into the silicon carbide body,
wherein the shielding region laterally directly adjoins the source region and the body region,
wherein the shielding region is in contact with an inactive sidewall of a further trench gate structure,
wherein the body region comprises a first body portion directly below the source region and distant from the active sidewall,
wherein in at least one horizontal plane parallel to the first surface, a dopant concentration in the first body portion is at least 150% of a reference dopant concentration in the body region at the active sidewall,
wherein in the at least one horizontal plane parallel to the first surface, a horizontal extension of the first body portion is at least 20% of a total horizontal extension of the body region,
wherein the first body portion forms a bulge extending from the shielding region into the body region,
wherein a maximum lateral extension of the bulge is located a distance to the source region.

7. The silicon carbide device of claim 6, wherein in the at least one horizontal plane, the horizontal extension of the first body portion is at least 50% of the total horizontal extension of the body region.

8. The silicon carbide device of claim 6, wherein in the at least one horizontal plane, a lateral dopant distribution in a portion of the shielding region directly adjoining the first body portion deviates by not more than ±10% from a dopant concentration in the first body portion.

9. The silicon carbide device of claim 6, wherein the first body portion is formed by a masked tilted implant.

10. The silicon carbide device of claim 6, further comprising a body contact area laterally directly adjoining the source region.

* * * * *